United States Patent [19]

Kuhar et al.

[11] 4,200,913
[45] Apr. 29, 1980

[54] OPERATOR CONTROLLED PROGRAMMABLE KEYBOARD APPARATUS

[75] Inventors: Eugene Kuhar; Donald L. Smith, both of Boca Raton, Fla.

[73] Assignee: International Business Machines Corporation, Armonk, N.Y.

[21] Appl. No.: 787,401

[22] Filed: Apr. 13, 1977

[51] Int. Cl.² .................... G06F 15/02; G06F 3/14
[52] U.S. Cl. ........................................... 364/900
[58] Field of Search ... 364/200 MS File, 900 MS File, 364/709

[56] References Cited

U.S. PATENT DOCUMENTS

| | | | |
|---|---|---|---|
| 3,355,714 | 11/1967 | Culler | 364/200 |
| 3,419,850 | 12/1968 | Krammer | 364/200 |
| 3,533,078 | 10/1970 | Perkins et al. | 364/200 |
| 3,668,653 | 6/1972 | Fair et al. | 364/200 |
| 3,760,171 | 9/1973 | Wang et al. | 364/200 |
| 3,859,635 | 1/1975 | Watson et al. | 364/200 |
| 3,971,925 | 7/1976 | Wenninger et al. | 364/900 |
| 4,063,221 | 12/1977 | Watson et al. | 364/900 |

*Primary Examiner*—Gareth D. Shaw
*Assistant Examiner*—Thomas M. Heckler
*Attorney, Agent, or Firm*—John C. Black

[57] ABSTRACT

A cathode ray tube (CRT) and keyboard display terminal are operated in accordance with the program routines of a microcontroller. The microcontroller includes a random access store which is loadable by the customer during initial program load (IPL) operation to store customer selected program routines for controlling the CRT display and keyboard and for initializing tables in the store which define the customer selected character and symbol set. The tables provide data for determining the functions which are to be performed incident to the depression of each key and since these are customer loadable, the functions can be changed by reinitializing the system. These tables provide the mechanism whereby an operator making use of the keyboard can manually change the functions of each and every key on the keyboard except one key which is dedicated to the function of redefining the functions of other keys. This mechanism permits the operator to manually chain together a large number of functions which will be executed in sequence incident to the depression of a single key which has been selected and redefined to perform all of the desired functions. A redefined key may be returned to its original function by the operator by means of manipulation of the redefine mode key and the key which has been redefined.

9 Claims, 17 Drawing Figures

OPERATOR CONTROLLED PROGRAMMABLE KEYBOARD APPARATUS

RELATED APPLICATIONS

Application Ser. No. 681953 filed on 4/30/76 by M. I. Davis entitled "Task Management Apparatus", now U.S. Pat. No. 4,047,161, assigned to the assignee herein describes a preferred form of the host processor with which the present apparatus is particularly well adapted to operate.

U.S. Application Ser. No. 682229 filed on 4/30/76 by M. A. Bouknecht, M. I. Davis and L. P. Vergari entitled "Input/Output Interface Logic for Concurrent Operations", now U.S. Pat. No. 4,038,642, and assigned to the assignee herein describes a preferred form of the I/O devices, channel and interface with which the present apparatus is particularly well adapted to operate.

BACKGROUND OF THE INVENTION

This invention relates to programmable keyboard mechanisms and, more particularly, to a programmable CRT display/keyboard terminal with program controlled means responding to operation of keys by an operator for changing the functions of other keys on the keyboard.

In recent years the requirements of keyboard display users have become so widely varied that there has been a continuous and ever-growing requirement for greater and greater flexibility in the products being marketed. Because of the ever increasing pressures from the marketplace, manufacturers have been increasing the flexibility of their systems by providing customer programmable display terminal systems in order to provide several different customers with totally different requirements with the same basic hardware mechanism.

It is the primary object of the present improvement to further enhance these programmable display terminal systems so as to give the customer a greater degree of flexibility in tailoring standard hardware to his specific requirements.

SUMMARY OF THE INVENTION

A primary object of the present invention is to provide a keyboard operator with greater flexibility and a substantially unlimited ability to manually reprogram the key functions or groups of key functions which are performed by the keyboard apparatus in response to the depression of a single key.

A related object is to provide the operator with the flexibility of changing or reprogramming the functions for each and every key on the keyboard except one dedicated "define mode" key which is provided for controlling the reprogramming function. This define mode key which is used to redefine the functions performed by the other keys in accordance with the operator's desires is also used to restore a redefined key or all redefined keys to their original functions.

It is another object to provide an improved method and means for redefining key functions under programmer control via IPL reinitialization of the system and under manual operator control via the keyboard.

These objects are achieved in a preferred form of the invention by providing (1) an electronic keyboard which produces a multi-bit output code in response to each depression of a key, (2) a microcontroller which is dedicated to the control of the keyboard and associated video display, and (3) write/write store having modifiable tables directing the key function definition and execution. Instructions which are stored in both a read only store (ROS) and in a read write store control the functions of the microcontroller. The read write store is loaded with a plurality of tables for controlling the display and keyboard functions. One character generator table provides the matrix bit data for each of the graphic or character images which can be produced on the video display.

A group of 4 tables provides the translation mechanism for each key on the keyboard. A first one of these tables is a key attribute code table which defines the type of key which has been depressed; that is, whether it is a graphic key or a local function key, an interrupt key or a combination of graphic and interrupt, or local function and interrupt. A second table provides the actual graphic codes or local function codes for each of the keys on the keyboard. A third table provides the interrupt codes for those keys on the keyboard which have an interrupt function assigned to them. Accessing of the second and third tables is achieved in part as a result of the attribute code in the first table. A fourth table in the group provides the storage area wherein a series of functions defined by other keys may be chained together for execution incident to the depression of one redefined key. Access to this latter alternate defined code table is also obtained in part by the key attribute code assigned to a particular depressed key the function of which has been redefined.

The ROS instructions are permanently embedded and allow a facility for communication to and from the host processor via a standard interface channel, and also allow a facility via a set of channel associated instructions to load the required microcontroller instructions for the local assignable keyboard functions and the keyboard data tables all contained in the read/write store.

The ROS controller instructions provide the means for loading the content and order of the character image buffer, which is the display system character generator.

The user loadable character generator image buffer provides the user with a programmable means of altering not only the specific code assignment for any particular graphic image character, but also the actual screen image pattern representation which define the video monitor screen image. The entire character generator image buffer contents are loaded from an I/O device via the host processor.

The local keyboard functional routines are comprised of a collection of fundamental display terminal operations such as tab right, cursor left, new line, set tone ON, etc. These functions are labeled with a number which is assigned in the proper function tables to any individual key code or, conceivably, to all key codes emanating from the keyboard unit. The collection of local keyboard functional routines is theoretically infinite, but, for practicability, is restrained to a somewhat limited list which is containable within the allowable read/write instruction storage address size allocated for local function routines within the display terminal attachment.

The user tables consists of a series of similar tables each of which is based upon the maximum number of keyboard codes allowed; e.g., 256 keyboard codes, derived from 8 keyboard data lines. Thus in the preferred embodiment each user table is limited to a 256 address length, one table address for each keyboard scan code.

There is one basic user assignment table, the key attribute table, that defines which keyboard attributes have been assigned to each and every key code. A limited list of functional display terminal keyboard attributes is as follows:

1. graphic keys (00) consisting of normal alphanumeric and special symbols displayable on the display 10,
2. local function keys (20) which define local display oriented operator functions such as tab right and tab left, move cursor up, move cursor down, etc.,
3. interrupt keys (30) which cause an interrupt code to be sent to the central processing unit 1 from the display attachment,
4. graphic and interrupt keys (70) which normally display a graphic character and subsequently cause an interrupt code to be sent to the central processing unit,
5. function and interrupt keys (60) which normally cause a local display oriented operator function such as tab right, up cursor, etc. and cause an interrupt code to be sent to the central processing unit,
6. a define key (40) which allows the local operator using the keyboard to redefine the function of any key on the keyboard and
7. redefined keys (80) which indicate that particular keys have been redefined by the local operator to an alternate function or string of functions.

The key function attribute code derived from the key function table is normally used by the microcontroller program to index to one of two secondary tables, the first table containing either the graphic character or local function code and the second table containing interrupting codes.

Other display terminal attributes can be assigned as the need requires. The user defined key attribute code table data content is made up from the display terminal keyboard attribute codes listed above for the entire 256 allowable key codes. This table directs the controller instruction sequence to index to other user assignable tables, as required, to obtain other user defined data, such as the character code for a graphic key, the function code for a local function key and the interrupt code for an interrupt key.

The following description is an example of the "single thread" path for the major programming sequence steps required for entering and/or indexing into the various user defined tables in response to the depression of a key having a scan code of F9 (Hex).

The microcontroller instruction program detects the key depression and accepts the associated key code data.

The key function attribute table is indexed to address XF9. The contents of that address is an 04 (Hex), indicating a graphic character and interrupt attribute preassignment for the scan code of F9.

The graphic code/local function code table is indexed to YF9 (Hex). The contents of that address contain a code of Cl (Hex), which is the EBCDIC data for upper case "A". The character code (Cl) is entered into the display refresh buffer as graphic screen information.

The interrupt table is indexed to ZF9 (Hex). The contents of that address contains a code of 03 (Hex), which is an interrupt code. The microcontroller subsequently interrupts the host processor with an interrupt code of 03 to indicate which key was actuated.

The primary improvement lies in the operator programmable keyboard feature which is a local keyboard function that allows the keyboard operator to redefine the attribute of any key, which had previously been defined by appropriate assignments in the user tables allowing the operator to select, from the full set (library) of available and assigned key functions, any sequence of those same key functions, to be assigned to any particular keyboard key position.

This feature requires the introduction of a mode of operation to the display terminal system, called key definition mode. In this mode, the local keyboard operator defines the sequence of local key functions that is to be assigned to any particular selected key. Once the sequence of functions has been defined the operator exits the key definition mode, and any subsequent depression of the selected (re-defined) key causes execution of the total sequence of local key functions that were operator assigned for that key in the order of operator re-assignment.

Any key on a given keyboard layout may be reassigned, excluding the key definition mode key. Thus, one key on a given keyboard layout must be user selected to cause the display terminal system to enter the key definition mode. This selection is accomplished by pre-assignment of that user selected key position, in the user key attribute table, to the local function called key definition mode. That user selected and assigned key, once assigned, is reserved and not reassignable by the operator, except through external modification of the tables and a reload of the read/write store instruction data. That same user selected key is used as the key to exit the key definition mode.

The following sequence of steps redefines the function of a key:

Depress the key definition mode key to cause the controller to enter the key definition mode.

Depress the selected key to be redefined.

Depress keys whose functions are to be chained together for the redefined key in the sequence of desired order of functional execution.

Depress the key definition key. This second key depression causes the controller to exit the key definition mode.

To return a redefined key to its original assigned function, the operator depresses the key definition mode key to enter the key definition mode, depresses the key that is to be returned to its original function, and depresses the key definition mode key to exit the key definition mode.

To return all redefined keys to their original key functions simultaneously, the operator depresses the key definition mode key to enter the key definition mode and again depresses the key definition mode key to exit the key definition mode.

In the preferred embodiment, the function of a key is redefined as described above by first depressing the define mode key. The key attribute code table is accessed to determine that the attribute code 40 is present and the system is conditioned to be in the defined mode.

When the microcontroller routine detects the next depressed key, it again accesses the key attribute code table to determine the attribute code of the key to be redefined. It searches the alternate define table for the next available address in the table which is empty and available for use. This next address is stored into the graphic character/local function table at the position assigned to the key which has been depressed for redefinition. The graphic character/local function code of the key to be redefined is moved from the graphic character/local function table into the second free position which has been found in the alternate define table. In addition, the original key attribute code of the redefined key and its key code are also stored in the alternate define table.

As each subsequently depressed key other than the define mode key is sensed by the microcontroller, its key code is stored into the next available position in the alternate define table in the sequence in which the keys are depressed. When the define mode key is again depressed, its key code is entered into the alternate define table completing the data which has been stored for the redefined key. When the redefined key is later depressed for execution of the sequence of functions which have been reassigned to it, the key attribute code table is accessed at the position which is assigned to the redefined key. The redefined attribute code key of 80 is detected and making use of the graphic character/local function table to gain access to the index address into the alternate defined table each of the key codes assigned to the redefined key is accessed in sequence and its function is executed. This process continues until the define mode key code is accessed and detected in the alternate define table to determine the end of the functions to be performed by the redefined key.

It will be appreciated that all keys on the keyboard may be redefined or rather be in their redefined conditions concurrently. Obviously only one key may be redefined at one instant in time.

When a particular redefined key is returned to its original function, the key attribute code and the graphic character/local function code are returned to their original locations in their respective tables. In addition, that portion of the alternate define table in which data for the redefined key has been stored is reinitialized and the entire table is compressed to eliminate spaces between redefined key data sections.

Other objects and features will be apparent upon a perusal of the following detailed description of the preferred embodiment of the invention as is illustrated in the accompanying drawings.

DESCRIPTION OF THE PREFERRED EMBODIMENT

Figure 1:
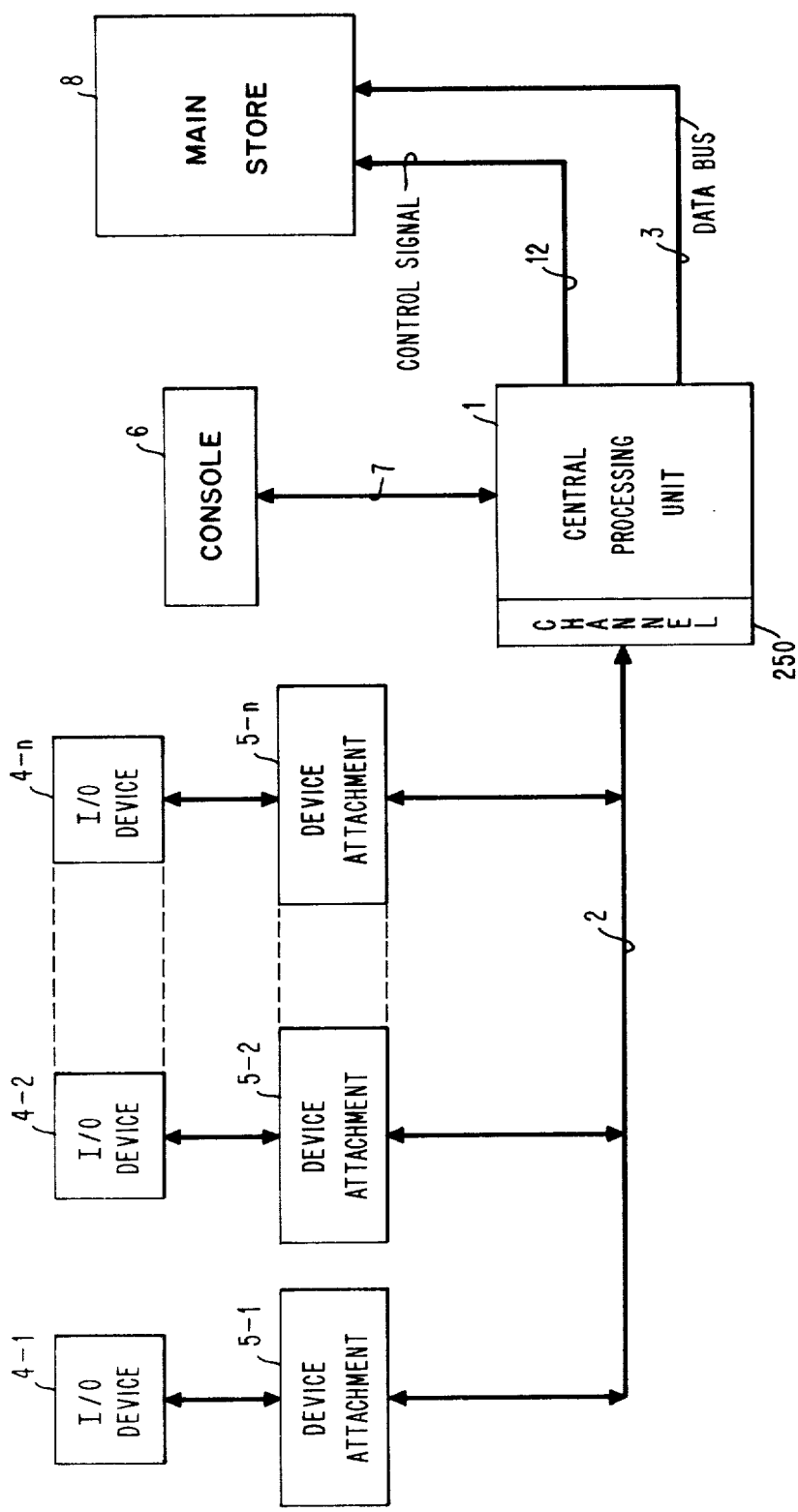
FIG. 1 diagrammatically illustrates a data processing system incorporating the present improvement.

FIG. 1 is an overview block diagram of a preferred system within which the present improvement is incorporated.

The central processing unit (CPU), or processor 1, executes instructions and controls activity on the primary interface of the system, the input/output (I/O) Interface 2.

A plurality of input/output (I/O) devices 4-1 to 4-n are coupled to the I/O interface bus 2 by way of respective device attachments 5-1 to 5-n. The device attachments 5-1 to 5-n, together with the CPU 1, control the transfer of data between the CPU 1 and the I/O devices, 4-1 to 4-n. It will be assumed that the I/O device 4-n is a keyboard/display terminal.

The CPU 1 is coupled to a main storage 8 via a data bus 3 and control bus 12.

An operator console 6 is coupled to the CPU 1 by way of an interface bus 7.

Figure 2:
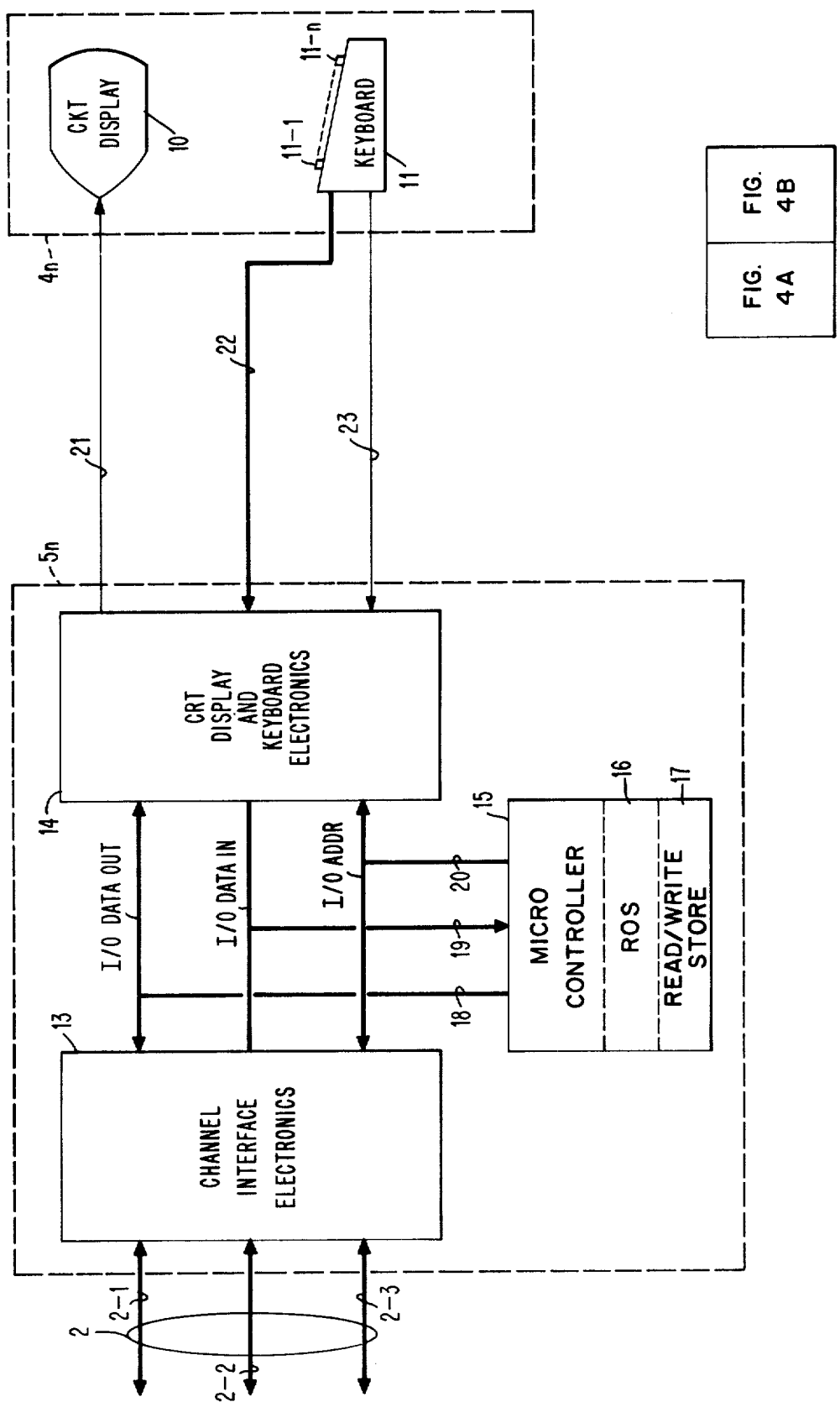
FIG. 2 diagrammatically illustrates a preferred form of the control apparatus within which the present improvement is incorporated.

The interface bus 2 includes an I/O address bus 2-1, an I/O data bus 2-2, and an I/O interface control and status bus 2-3 as shown in FIG. 2.

The display terminal attachment 5-n (FIG. 2) includes channel interface electronics 13, CRT display and keyboard electronics 14 and a microcontroller 15 with an associated read only store (ROS) 16 and a random access (read/write) store 17. The channel interface electronics 13 is coupled to the central processing unit 1 by way of the interface bus 2. The channel interface electronics, the CRT display and keyboard electronics 14 and the microcontroller 15 are interconnected by means of an I/O data out bus 18, an I/O data in bus 19 and an I/O address bus 20.

The instructions for all of the routines executed by the microcontroller 15 are stored in the ROS 16 and the random access store 17. Those instructions which control the transfer of data between the attachment 5-n and the CPU 1 are stored in the ROS 16 because they do not change in the preferred embodiment described herein. Those instructions which are executed to control the display 10 and the keyboard 11 of terminal 4-n are stored in the random access store 17. All functions which are performed in the attachment 5-n and the terminal 4-n are controlled by the microcontroller 15 in accordance with instructions in the stores 16 and 17 with the exception of the continuous scanning of a refresh buffer 30 (FIG. 4A) and an associated character generator 31 (FIG. 4B) to continuously write data onto the screen of the CRT display 10.

The CRT display and keyboard electronics 14 is coupled to the display 10 by way of a composite video line 21. The same electronics 14 is coupled to the keyboard 11 by way of a data bus 22 and a strobe line 23.

Figure 3:
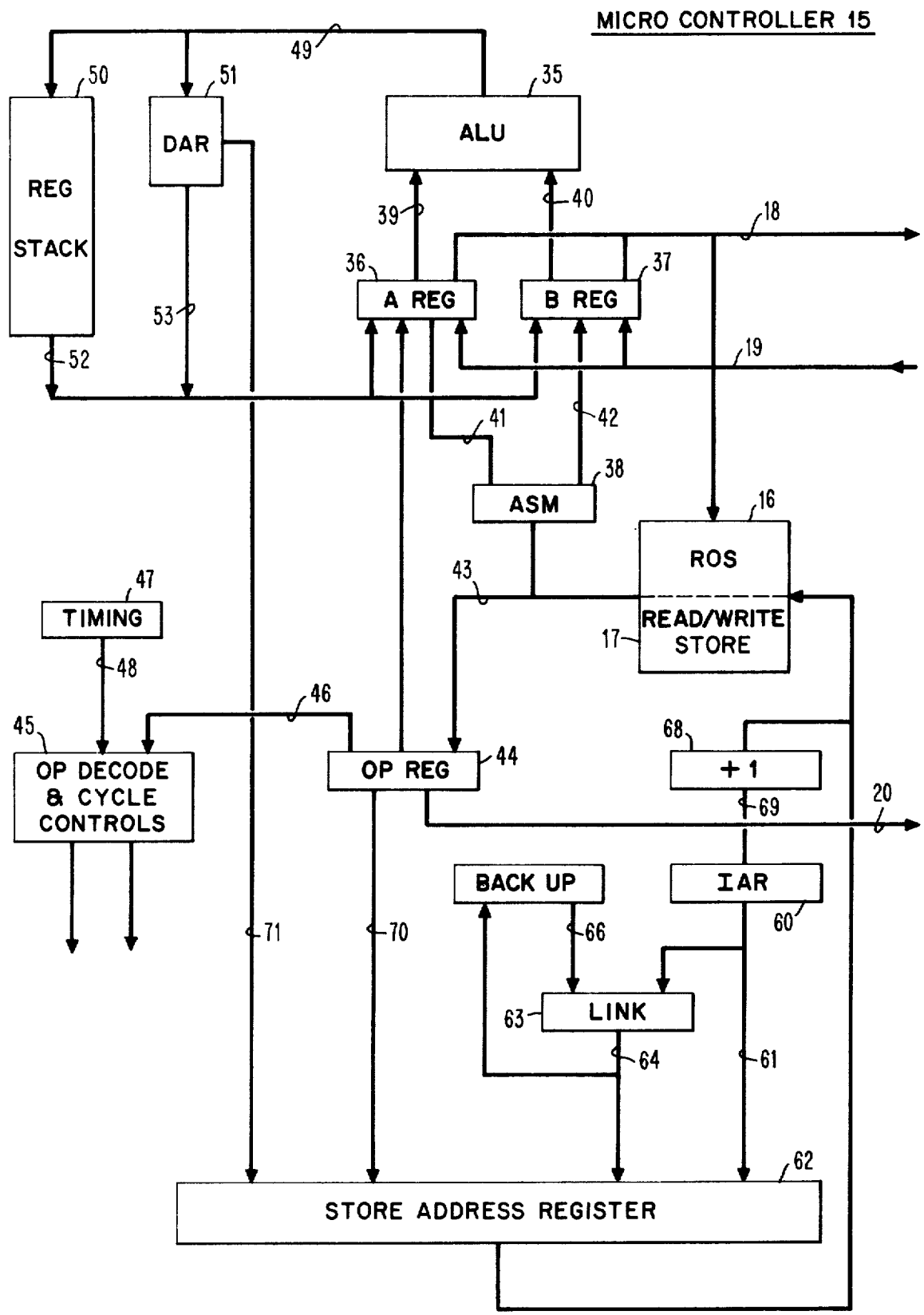
FIG. 3 is a schematic diagram of a preferred data flow of a microprocessor used to implement the present improvement.

The microcontroller 15 is shown in greater detail in FIG. 3. The microcontroller 15 is of conventional construction including basic timing 47 and cycle controls 45 for executing the required sequences of events, a ROS 16 and a read/write store 17 for holding sequential instruction routines, an operation register 44 for decoding the instructions, and a storage address register (SAR) 62 for addressing the ROS 16 and store 17. It also contains an instruction address register (IAR) 60 and an incrementing register 68 which increments addresses by 1. It also contains an arithmetic and logic unit (ALU) 35, a data address register (DAR) 51 and a general working register stack 50. Also contained is a backup register 65 and a link register 63 which provides one level of instruction nesting.

The instructions contained in the ROS 16 and the instructions that are user loaded into the store 17 will be described briefly. The ROS 16 contains a fixed set of sequential instructions that control loading of user variable instructions into the store 17 from the CPU 1 via the channel 250, the interface bus 2, electronics 13 and the microcontroller 15.

The loading of data under control of software from the host CPU 1 to the store 17 is achieved in a conventional manner. For example, assume one of the I/O devices, such as device 4-1, is a magnetic disk which includes on it an initial program load (IPL) program and the data to be loaded into store 17. The CPU 1 initiates the IPL program causing the device attachment 5-1 to initiate reading of the IPL program from the device 4-1. The data is transferred from the device 4-1 to main store 8 by way of the attachment 5-1, the interface bus 2, and the CPU 1. A portion of the data loaded into main store 8 includes the program routines which are to be stored in random access store 17. These programs are therefore transferred from main store 8 to the device attachment 5-n by way of the interface bus 2. In order to achieve this loading of the random access store 17, it is necessary to utilize the microcontroller 15 and ROS 16. The instruction sets which are required for the transfer of data between the central processing unit 1 and the microcontroller 15 are permanently stored in the ROS 16. Since this is not an essential part of the invention being claimed herein, and since the loading of storage devices during IPL procedures is well known, it will not be discussed in further detail herein. The IBM TECHNICAL DISCLOSURE BULLETIN, Vol. 19, No. 9 (February 1977) pages 3278-3280 describes such a procedure.

The microcontroller 15 also includes a pair of input registers 36 and 37 coupled to the ALU 35 by way of output busses 39 and 40. The output of the registers 36 and 37 can also be gated to the I/O data bus 18. The output 49 of the ALU 35 is coupled to the working register stack 50 and to the data address register stack 51. The outputs of the registers 50 and 51 are coupled to inputs of the registers 36 and 37 by way of outputs 52 and 53.

The I/O data input bus 19 forms additional inputs to the registers 36 and 37. A further input to the registers 36 and 37 is provided by the outputs 41 and 42 of an assembler 38. The assembler in turn is coupled to the output 43 of the combination ROS and read/write stores 16, 17.

It will be noted that the ROS 16 and store 17 are treated as a common store with a common data input/output and common addressing. Thus, a single data input to the stores 16, 17 is provided by the registers 36 and 37 by way of the I/O data out bus 18. The stores 16, 17 have a single data output bus 43 which is coupled to the assembler 38 and to the operation register 44. Addressing for the storage 16, 17 is provided by the storage address register (SAR) 62. During normal accessing of sequential instructions for execution, each address stored in the SAR 62 is applied to the addressing circuits (not shown) of store 16, 17 and also to the incrementer circuit 68. The incrementer 68 increments the address received from the SAR 62 and places it in the instruction address register (IAR) 60 from which it is then gated back into the SAR 62 at an appropriate time to access the next instruction.

Another input to SAR 62 is provided by an output 71 of the DAR 51. This address is derived from DAR registers 0-2 (FIG. 8) and is utilized by the SAR to access data (as opposed to instructions) from the store 16, 17. Another input to the SAR 62 is derived from the operation register 44 by way of its output 70 to form partial addresses during branch operations.

In the event of a branch and link operation, the address stored in the IAR 60 is transferred to a link register 63 and from there to a backup register 65. The link register 63 provides a first level of subroutine nesting and the backup register 65 provides a second level of subroutine nesting. When control is returned to the first level of nesting, the link register 63 provides the input to the SAR 62 via its output bus 64. When return is made to the second level of nesting, the address in the backup register 65 is transferred to the link register 63 via its output bus 66 and from there it is transferred into the SAR 62.

The register stack 50 provides the local or working register storage for the microcontroller. For ease of explanation, gating circuits have not been illustrated since these details are old and well known in the art.

The display and keyboard electronics 14 of FIGS. 4A, 4B will now be described in greater detail. When a key 11-1 to 11-n on the keyboard 11 is depressed, the corresponding unique 8 bit key code is applied to the bus 22 of FIG. 4B When the key is depressed, a strobe pulse is also applied to a keyboard strobe line 23 which sets a keyboard strobe latch 81 and also sets the latch 80 to store the key code from bus 22. A sense gating line 82 is derived from the microcontroller when it is searching for a key which has been depressed. Similarly, a pulse on the sense line 83 will gate the output of the keyboard latch 80 to the DBI 19 when the microcontroller is determining the identity of a depressed key, after the microcontroller has sensed a keyboard strobe pulse at the output of the strobe latch 81.

Figure 5:
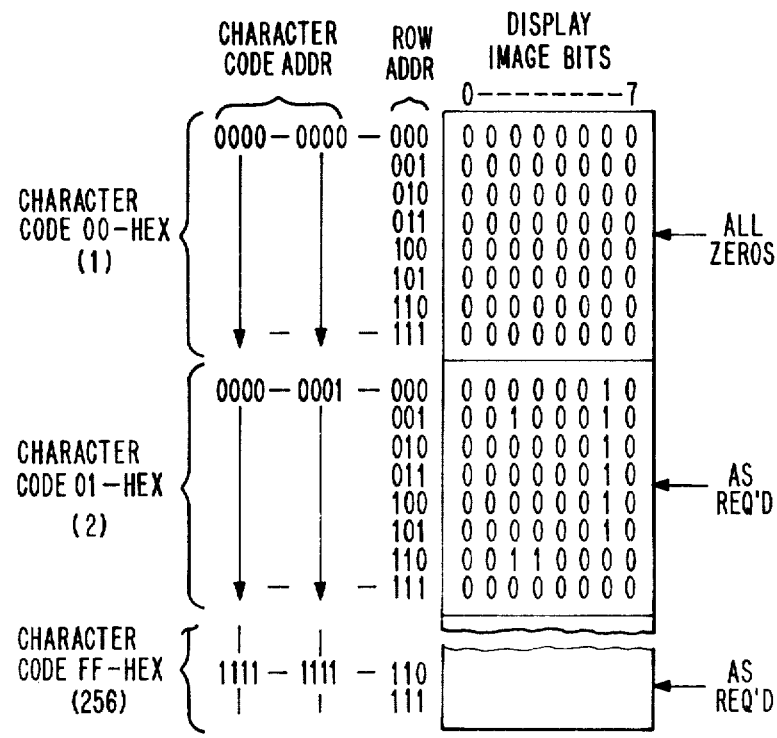
FIG. 5 is a fragmentary view of the character generator of FIG. 4B.

The writing of characters on the screen of the CRT display 10 is under the control of the refresh buffer 30 and a character generator 31. The bit patterns to be applied to the display 10 are stored in the character generator 31 (FIG. 5) whereas the identity of each character to be written in a specified portion of the display is stored in a corresponding location in the refresh buffer 30. A storage position or location is provided in the refresh buffer 30 for each character position available on the screen of the display 10. The output of the character generator 31 is coupled to the CRT video line 21 by way of a polarity hold latch register 85, a serializing shift register 86, and alternatively gates 87 or 88. When 7 row bits of information representing one line of one character are transferred from the character generator 31, they are transferred in parallel to the 7 bit register 86. Each of these bits is then serially shifted from the leftmost bit to the rightmost bit (FIG. 5) from the shift register 86 into the gate circuits 87 or 88 depending upon whether the output signal is to be dim or bright. Suitable blanking pulses are applied to the gates 87 or 88 via OR circuit 98. Reference is directed to FIG. 5 which shows the storage of image bits in the character generator 31 and the addressing of the generator 31 to select each 8 bit row of bits.

The generation of characters on the CRT display is well known, it being described in detail in many publications; e.g. the IBM TECHNICAL DISCLOSURE BULLETIN, Vol. 19 No. 9 (February 1977) pages 3260-3265, and Vol. 17 No. 5 (October 1974) pages 1273, 1274. Character generation will, therefore, be described only briefly.

Figure 4A:
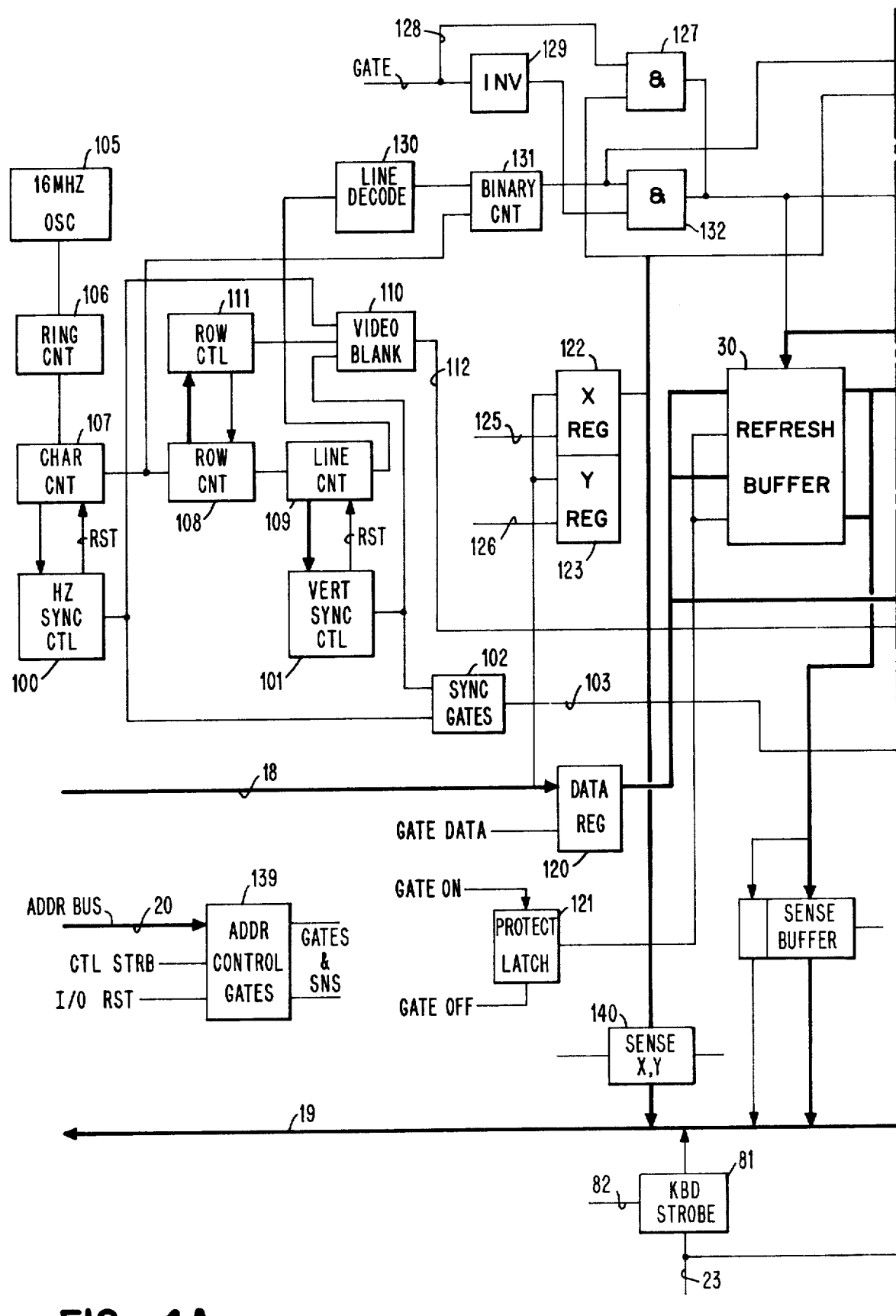
FIGS. 4A, 4B illustrate a preferred form of the keyboard/display circuits used to implement the present improvement.
Figure 4B:
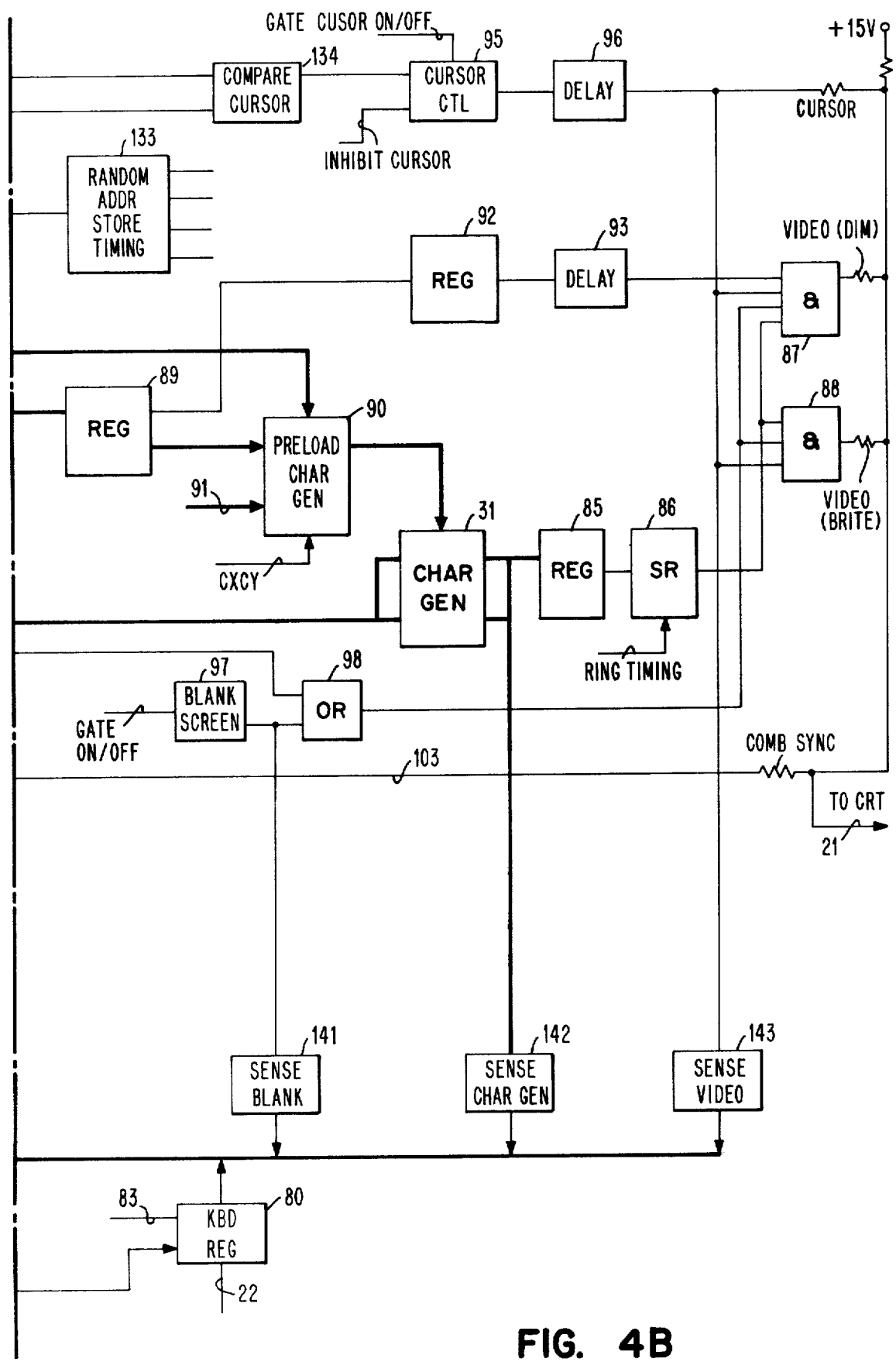

Timing for the CRT display and the circuits of FIGS. 4A, 4B is provided by an oscillator 105, a ring counter 106, a character counter 107, horizontal and vertical SYNC controls 100 and 101, row and line counters 108 and 109, line decode 130, binary counter 131, AND gate 132 and timing circuit 133, which timing circuits are of conventional construction and well known.

In order to complete one frame of writing on the display 10, the entire refresh buffer 30 must be scanned once. The characters comprising the first (topmost line) to be displayed are accessed in order from left to right to address in sequence the corresponding character data in generator 31 (FIG. 31) to read out the character bits in row 000 of each character. This procedure is repeated for each row 001-111 to complete the first line of characters. Then the second line of characters is formed and so on until all lines are formed.

Each of the character generator 31 locations is scanned in sequence to access the character image bits of each character which is to be written in sequence on the screen row by row and line by line. However, at any one instant in time only one row of bits within a single character matrix will be generated. Thus, row counter signals on line 91 are applied to the preload character generator gates 90 and are concatonated with the derived character address bits from the polarity hold register 89 to form the full character generator address to fetch each row of the character image bits any one instant in time (see FIG. 5). As the raster scans the display screen row by row, the row counter is incremented by one for each row scan so that the next row of image bits will be selected from the character generator 31 for application to the composite video line 21.

The polarity hold register 89 receives from buffer 30 each address for selecting character bits from character generator 31 and also includes a storage location for a protect bit which causes the display data to be dimmed when protected formatted screen presentations are being written on the display 10. Thus, the protect bit is applied to the gating circuit 87 by way of a latch 92 and a delay circuit 93.

Conventional cursor controls are applied to the composite video line 21 by way of a control circuit 95 and a delay circuit 96. Blanking and unblanking of the video display is provided via a latch 97 and an output driver 98. The output of the driver 98 is applied to inputs of the gating circuits 87 and 88.

Conventional vertical and horizontal sync controls are applied to the line 21 by way of a horizontal sync control circuit 100, a vertical sync control circuit 101, synchronizing gates 102 and line 103. The vertical and horizontal synchronizing signal controls as well as the other timing controls of the display and keyboard electronics is provided by the 16 MHz. oscillator 105, the output of which is coupled to the ring counter 106 which is in turn coupled to the character counter 107. The character counter 107 is coupled to the row counter 108 which is in turn coupled to the line counter 109. Horizontal sync control 100 is controlled by the character counter 107 and the vertical sync controls 101 are controlled by the line counter 109. Automatic video blanking during the retrace periods is provided via the video blanking circuit 110 which has an input from the outputs of the horizontal sync control 100, the vertical sync control 101 and the row control 111. The output 112 of the video blanking circuit 110 is applied to the driver 98. These controls are conventional and well known in the art.

When graphic character data is to be entered into the refresh buffer 30 for writing new information on the screen of display 10 the data is entered via the DBO bus 18 and the data register 120, the output of which forms one input to the refresh buffer 30. The protect bit is entered into the refresh buffer by way of the protect latch 121, the output of which forms a data input to the buffer 30. During loading of the refresh buffer 30, the buffer addressing is provided via the X register 122 and the Y register 123. These addresses are also received over the data bus out 18 which forms an input to the registers 122 and 123. To load the registers 122 and 123 gating signals from the microcontroller via the address bus 20 and gates 139, are applied to the lines 125 and 136. The output of the X and Y registers are coupled to the refresh buffer 30 by way of gating circuits 127. Another input 128 of the gate 127 is provided by the microcontroller when it is desired to load or read the refresh buffer 30.

The addressing of the refresh buffer 30 when it is being cyclically scanned to write characters on the screen of the display 10 is provided by line decode 130, binary counter circuits 131 and AND gates 132, completely independent of the microcontroller 15. The momentary value of counter 131 is compared with the address values of registers 122, 123 in compare cursor circuit 134.

Addressing of the registers in FIGS. 4A, 4B and other gating functions are provided by the outputs of the address control gates 139. The address bus 20 from FIG. 3 and the control strobe line 138 and the I/O Reset line 137 from controls 45 of FIG. 3 provide the inputs to gates 138.

Status of certain circuits of FIGS. 4A, 4B are derived via gates 140-144 inclusive.

FIG. 5 shows the addressing scheme as well as the display image bits for the character generator 31 of FIG. 4B. Eight bit character code addresses are provided for accessing each of the character image bit matrices. The character image matrix is arranged in 8 rows of 7 data bits each. Logical 1 bits in the image matrices are those which produce the characters on the display 10. Thus, the image matrix comprised of all zeros for the character code 00 produces no image on the display 10, whereas the image matrix for the character code 01 produces a numeral 1 on the display when the image bits are combined with the unblanking pulses. Provision is made for a maximum of 256 character images.

Figure 6:
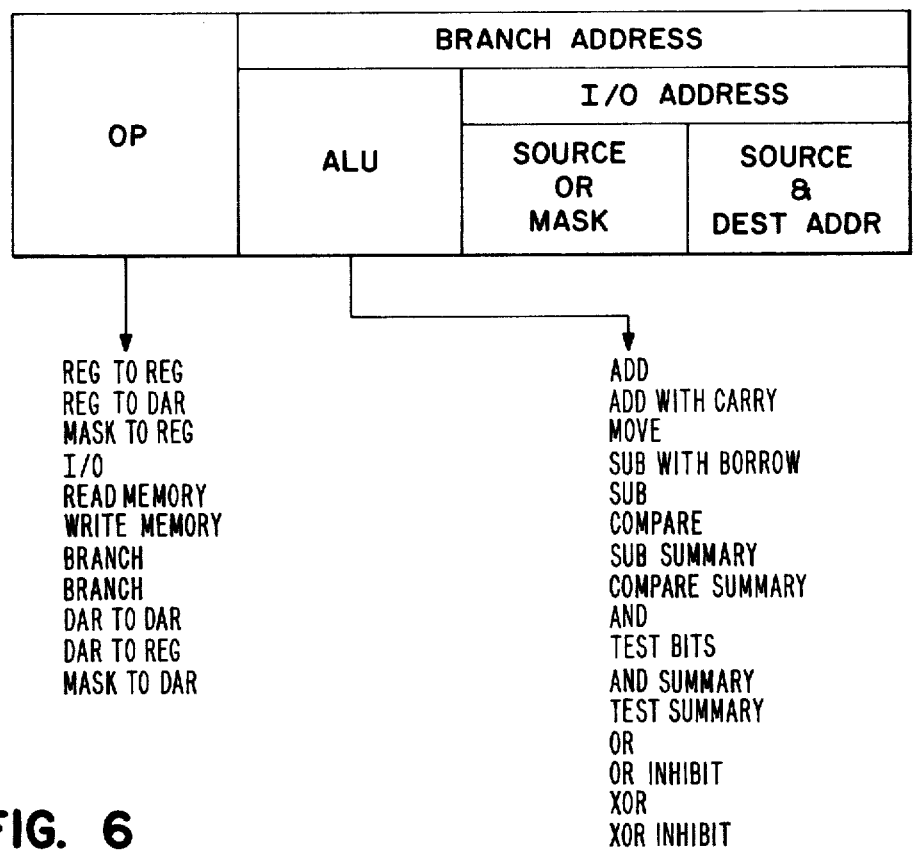
FIG. 6 illustrates a field map for an exemplary instruction set for the microprocessor of FIG. 3.

FIG. 6 is a map illustrating the fields which are provided for the instructions in the instruction set available to the microcontroller 15. The various operations listed in FIG. 6 may be executed in response to the decode of the OP field. Various arithmetic and logic functions illustrated in FIG. 6 may be executed by the microcontroller 15 in response to the decode of the ALU field during certain of the instructions. Alternatively these ALU field bits are used as a part of the branch address for certain other types of instructions. I/O device addresses are derived from the I/O address field; and during register operations the two source addresses and the destination address are derived from the respective fields shown.

Figure 7:
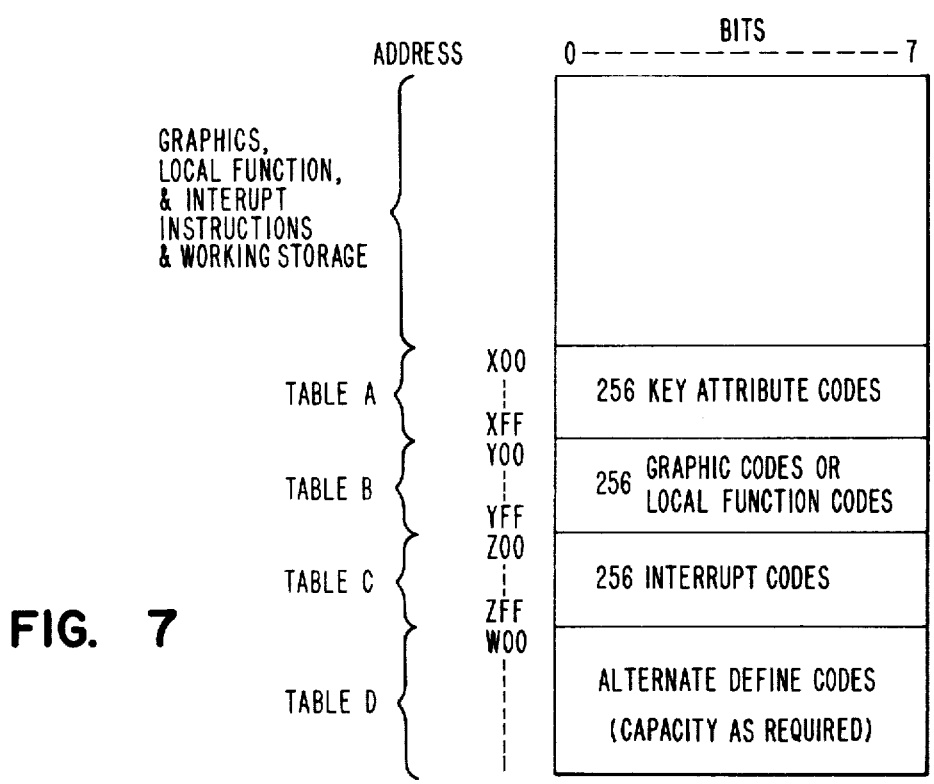
FIG. 7 is a map of the read/write store associated with the microprocessor and illustrates tables used to implement the present improvement.

FIG. 7 is a map of the read/write store 17 of FIGS. 2 and 3. The store 17 includes three user loadable tables, each of which have 256 locations, namely the key attribute table A, the graphic code/local function code table B, and the interrupt code table C. An alternate define code table D stores data which is required for redefining the functions to be executed by keys on the keyboard 11. The user loadable instruction routines for graphics, functions, local keyboard functions and interrupt functions are stored in the low order locations of store 17. This area also provides the working storage. In addition to the graphics, local function and interrupt routines being user loadable, the tables A, B and C are also made user loadable to provide greater flexibility to the keyboard display terminal equipment. Entries are made to the alternate define code table D by the terminal operator when manually changing the functions of selected keys.

Figure 8:
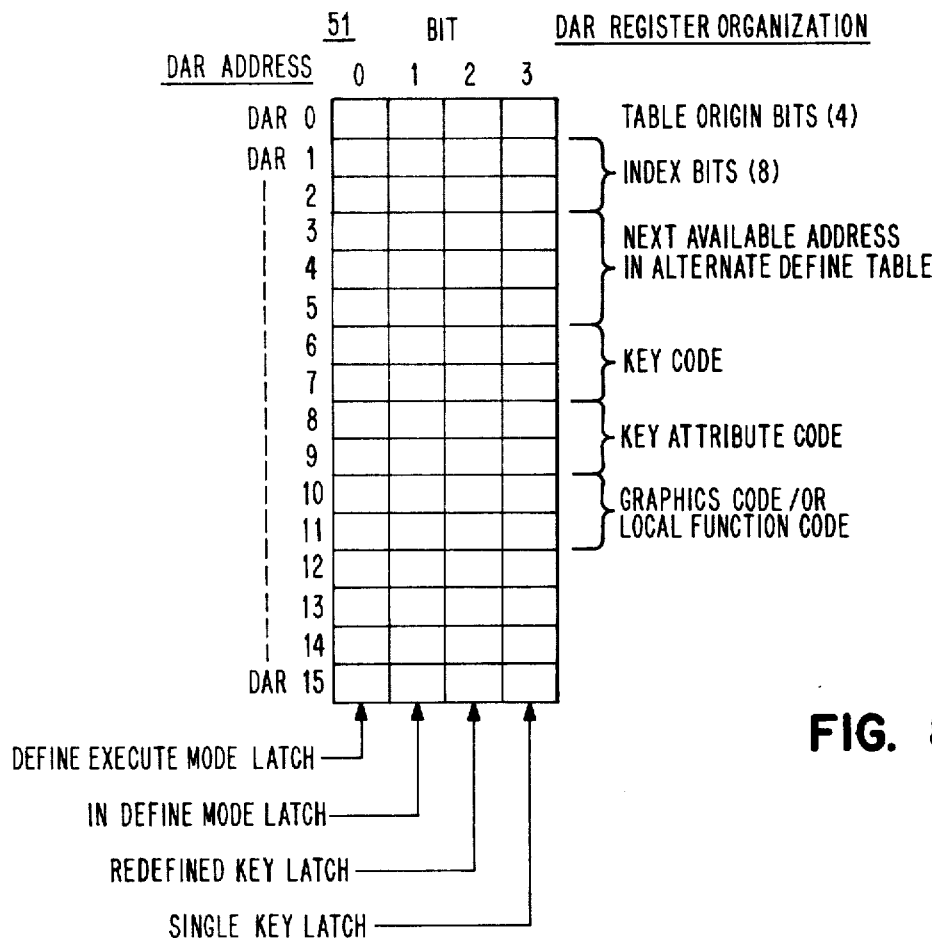
FIG. 8 is a map of the data address register (DAR) used to access the read/write store.

A map of the data address register (DAR) stack 51 is shown in FIG. 8. DAR registers 0, 1 and 2 are used to hold the address for accessing store 17 for data during any keyboard functional activity routines executed by the microcontroller (15). As will be seen below, DAR registers 3, 4 and 5 are used to store next available addresses for table D during the redefinition of key functions and during the execution of redefined key functions. DAR registers 6 and 7 are used for temporary storage of key codes. DAR registers 8 and 9 are used for temporary storage of key attribute codes. DAR registers 10 and 11 ae used for temporary storage of graphics code/local function codes. DAR registers 3–11 are preferably dedicated to the functions described.

DAR register 15 is dedicated to defining controller 15 "states" associated with the process of redefining the function of a key, and the execution of redefined key functions and the restoration of redefined keys to their original functions.

THE INSTRUCTION FLOW DIAGRAMS OF FIGS. 11-16

Figure 11:
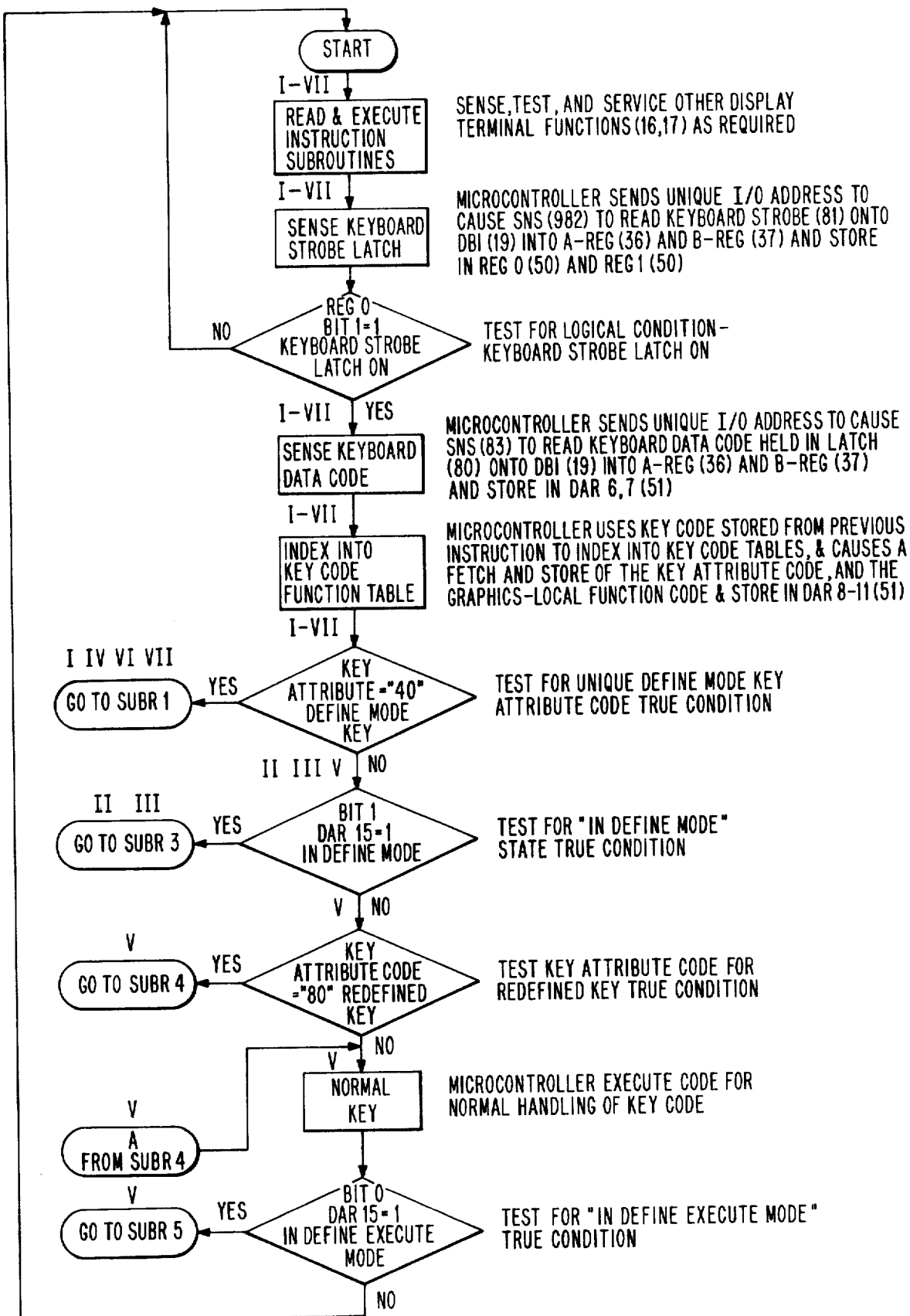
FIG. 11–16 are flowcharts illustrating a preferred program method and means for implementing the present improvement.

The flow diagrams of FIGS. 11–16 will now be described. These flow charts show generally the steps that are taken by the program instruction routines to respond to the keyboard 11 and to control the display. Several major functions pertinent to the present improvement are illustrated in the flow charts by the use of numerals I–VII for ease of tracing of the functions. These seven functions are:

I Redefine mode key
II Next key to be defined
III Define key functions
IV End define mode
V Redefined key execution
VI Restore single redefined key
VII Restore all redefined keys By way of example, the program steps which are illustrated in the upper half of FIG. 11 are general instructions steps and relate to all of the seven functions defined above. Therefore, I-VII are shown at the exit point of each of the program steps indicating that all seven functions follow this routine.

FIG. 11 illustrates the main line instruction flow diagram which is continuously being executed in a closed loop format. Selected events such as the detection of a key depression and the like are being monitored. Thus starting at the top of FIG. 11, the first block is the start of the program and the first significant program step is the reading and executing of instruction routines such as sensing, testing and various service functions that are required in typical keyboard display terminals. Many of these functions are often referred to as housekeeping routines. Upon an exit from such routines, the mainline program sends a pulse via line 82 to the keyboard strobe latch 81 in FIG. 4A to determine whether or not an operator has depressed one of the keys. In the event that a key has been depressed, the strobe latch output is gated on to the DBI bus 19 and is stored into the register 0, bit 1 of the working register stack 50. But whether or not there is a data bit latched up in the latch 81, the program continues to the next step where it reads out the contents of register 0 of stack 50 and checks bit 1 thereof for a logical 1 condition. In the event that it detects no logical 1 condition, the program is returned to the start condition as shown.

However, if a logical 1 bit is detected in the bit 1 position of stack register 0, the program continues on to the next sequential step to send a sense pulse to the keyboard register 80 via line 83 to gate the contents of the register 80 to the DBI bus 19. The contents of this register are routed via the DBI bus 19 into the A and B registers 36, 37 and thence into the DAR registers 6 and 7 of the stack 51. Bit 1 of the working register 0 is reset.

We now have the key code of the depressed key of the keyboard 11 stored in the stack 51. The program forces a constant "X" into the DAR register 0 and transfers the key code from DAR registers 6 and 7 to DAR registers 1 and 2. It then accesses the key attribute table A of store 17 using the address from DAR registers 0, 1 and 2. The key attribute code derived from table A is stored in DAR registers 8 and 9. The program then forces a second constant "Y" into DAR register 0 and uses DAR registers 0, 1 and 2 to access the graphics code/local function code from table B in store 17. This code which is accessed from store 17 is transferred to the DAR registers 10 and 11.

The key attribute code in DAR registers 8 and 9 is then examined to determine whether or not it is the define mode key "40". The execution of functions identified above by I, IV, VI, and VII require the detection of the define mode attribute code at this point in the routine. These functions will be described relative to the subroutine SUBR 1 of FIG. 12 below.

Assuming that functions defined by II, III or V are being executed at the moment, the test on the attribute key will indicate that it is a key other than the defined mode key and the program will advance to the next sequential step. Bit 1 of DAR register 15 is tested for a logical 1 condition to determine whether or not the apparatus is already in the define mode. If it is in the define mode, the program branches to subroutine SUBR 3 in FIG. 14 and this will be described in detail below with respect to function II and III. In the event that bit 1 in the DAR register 15 is a 0, the mainline routine continues on to the next sequential step. At this point the key attribute code in DAR registers 8 and 9 is again tested to determine whether or not the code is a redefined key code of "80". In the event that the attribute code is for a redefined key, the mainline routine branches to subroutine SUBR 4 of FIG. 15 which will be described in greater detail below with respect to function V. In the event that the attribute key is other than "80", then the mainline routine continues on to the next sequential step.

At this point, the mainline program has determined that the key which has been depressed has not had its function redefined and therefore the program can execute the routine for normal handling of the function assigned to that particular key. The steps which are executed to achieve this normal key handling function will be described in greater detail below with respect to an example shown in FIG. 9.

The mainline routine then continues on to the next sequential step in which bit 0 of the DAR register 15 is tested for a logical 1 condition. This test is required as a result of a return from the subroutine SUBR 4 of FIG. 15. This test determines whether or not the apparatus is in the define execute mode of operation. In the event it is in this mode of operation, a branch is made to the subroutine SUBR 5 of FIG. 15. In the event that bit 0 of DAR register 15 is a logical 0, a branch is made back to the start of the mainline instruction routine.

Figure 12:
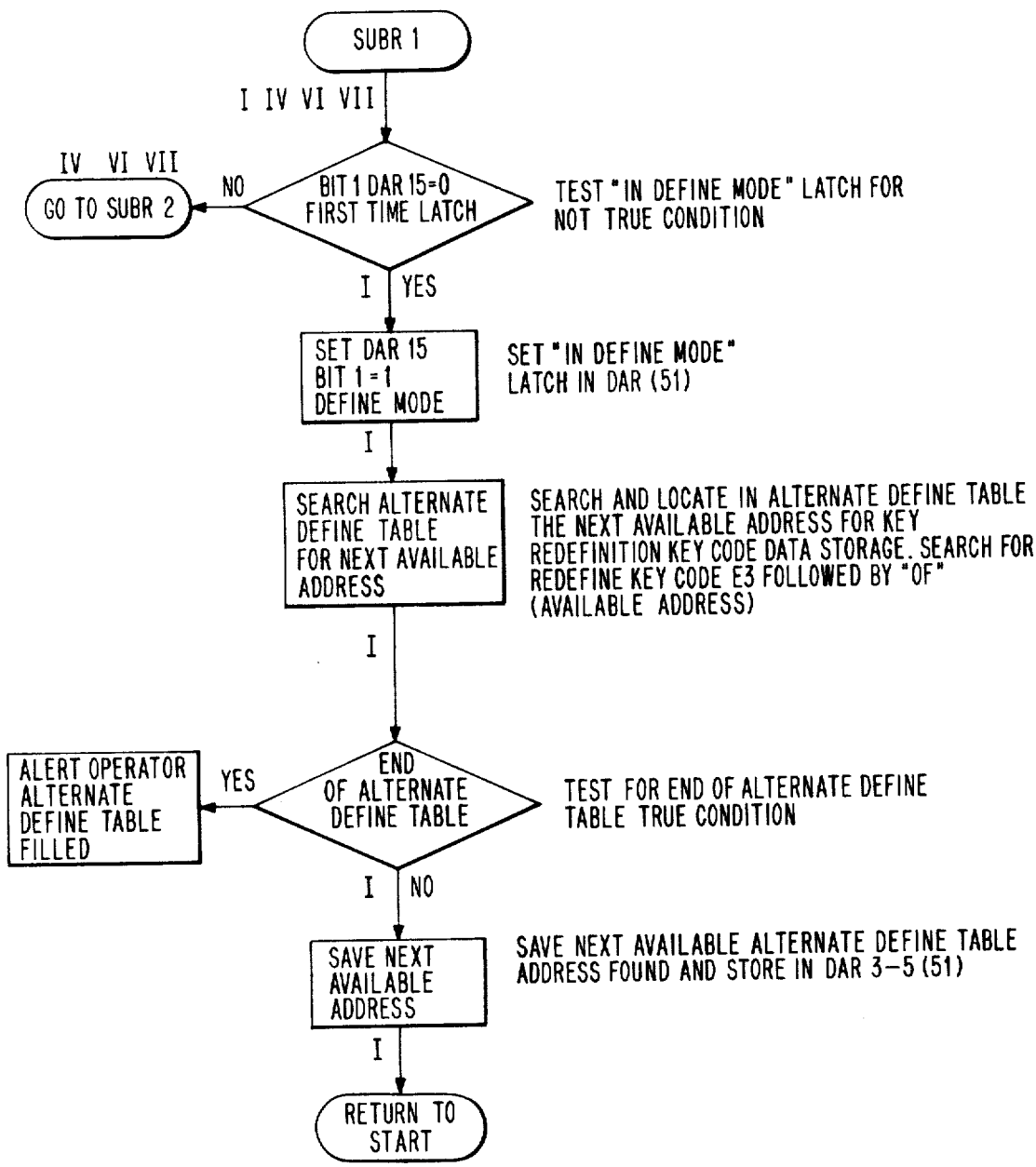

The subroutine SUBR 1 of FIG. 12 will now be described. It will be recalled that the mainline program branched to this subroutine when the define mode key "40" was detected. The first step in SUBR 1 is to test bit 1 of DAR register 15 for a logical 0 condition. The objective of this test is to determine whether or not this is the first time during the mainline routine that the define mode key has been sensed without taking consequent action. If a logical 1 state is detected, the subroutine branches to subroutine SUBR 2. In the event that a logical 0 condition is detected, the subroutine moves to the next sequential step. In this step a logical 1 bit is set into bit 1 of the DAR register 15 and the subroutine moves on to the next sequential step.

It will be noted that at this point in the instruction routines the mainline instruction routine has determined that the define mode key has been depressed and subroutine 1 has determined that no subsequent action has been taken yet. The next step to be performed is therefore a search of the alternate define table B for a next available empty address. The subroutine starts reading at the beginning address W00 of table D, reads out the contents. If the contents are determined to be the define mode key code E3, then a bit is set in one of the working registers of stack 50. The address in DAR 0, 1 and 2 which is used for accessing table D is incremented by 1 and the contents of the next table D location are accessed. If the contents of this next location are (0F), then another logical bit is entered into another position of the same working register as was used after detecting the define mode key code E3. This working register is then read out and the 2 bit positions are checked for logical 1's. In the event that logical 1 conditions are found in the preselected locations of the working registers, the first available address in table D has been found. This address is stored in DAR registers 3, 4 and 5. In the event that the contents of the second location in table D were any value other than 0F, the logical 1 bit set in the working register for the define mode detection as described above is removed from the register. This sequence of operations continues until 2 sequential locations of table D are found to contain "E3" followed by 0F are detected. The second of the two locations defines the next available table D location which can be used for redefining the function of the next key to be depressed by the operator.

If during the search of the alternate define table D for a next available address the address limit of the store 17 is exceeded, this condition is detected and the operator is alerted. To achieve this function, each time the address to the define table D is incremented, a test is made to determine whether or not the address value exceeds the maximum storage address value.

Assuming that the address value of the store 17 has not been exceeded, the subroutine SUBR 1 will save the next available address at DAR registers 3–5. The subroutine then branches to the start of the mainline routine awaiting the depression of the next key which is a key to be redefined.

Figure 13:
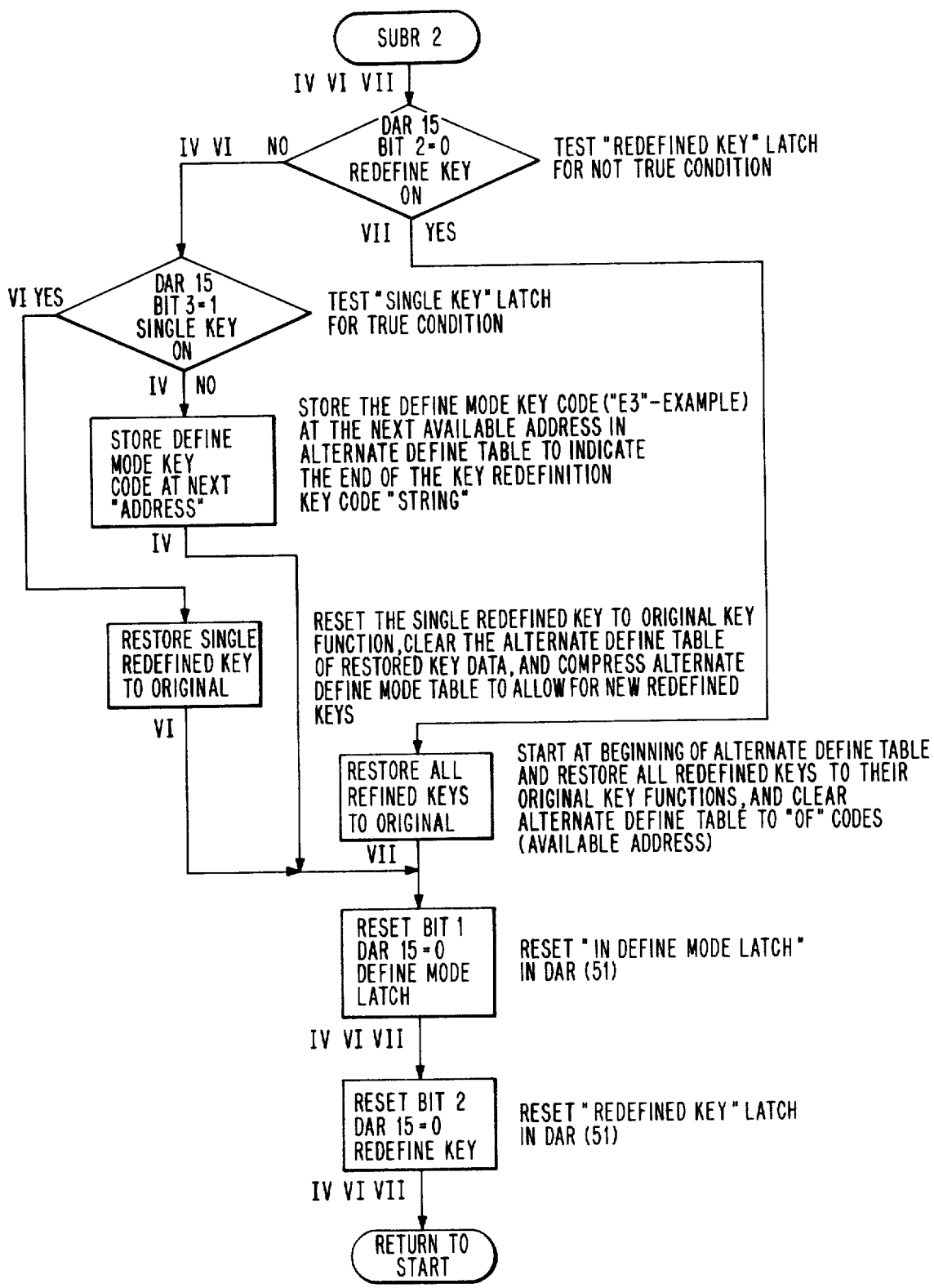

As described above, with respect to SUBR 1 of FIG. 12, a branch is made to subroutine SUBR 2 of FIG. 13 in the event that the first time latch had been in its logical 1 state when the define mode key was detected by the mainline routine. The first step in subroutine SUBR 2 is to test bit 2 of DAR register 15 for a logical 0 condition. This determines whether or not the redefined key latch has already been set, thereby indicating whether or not an attempt is being made to terminate redefinition of a key or to return one or more keys to their original function. In the event that the redefine key latch is in the logical 1 state, a branch is made to a step wherein a test is made to determine whether or not we are attempting to return a single key to its original function or whether we are terminating the redefining of the function for that key. Thus, bit 3 of DAR register 15 is tested for a logical 1 condition. If it is in the logical 1 condition, the single key which has been depressed is returned to its original condition. If the bit is a logical 0, we store the define mode key code at the next address in table D. This indicates the end of the redefinition of a key.

If when bit 2 of the DAR register 15 was tested, it was in the logical 0 state the program subroutine advances to the next sequential step which causes restoration of all of the redefined keys on keyboard 11 to their original functions. This function will be described in greater detail below. The subroutine then advances to the next sequential steps which are characterized by resetting of bits 1 and 2 of DAR register 15 to a logical 0 state.

Figure 14:
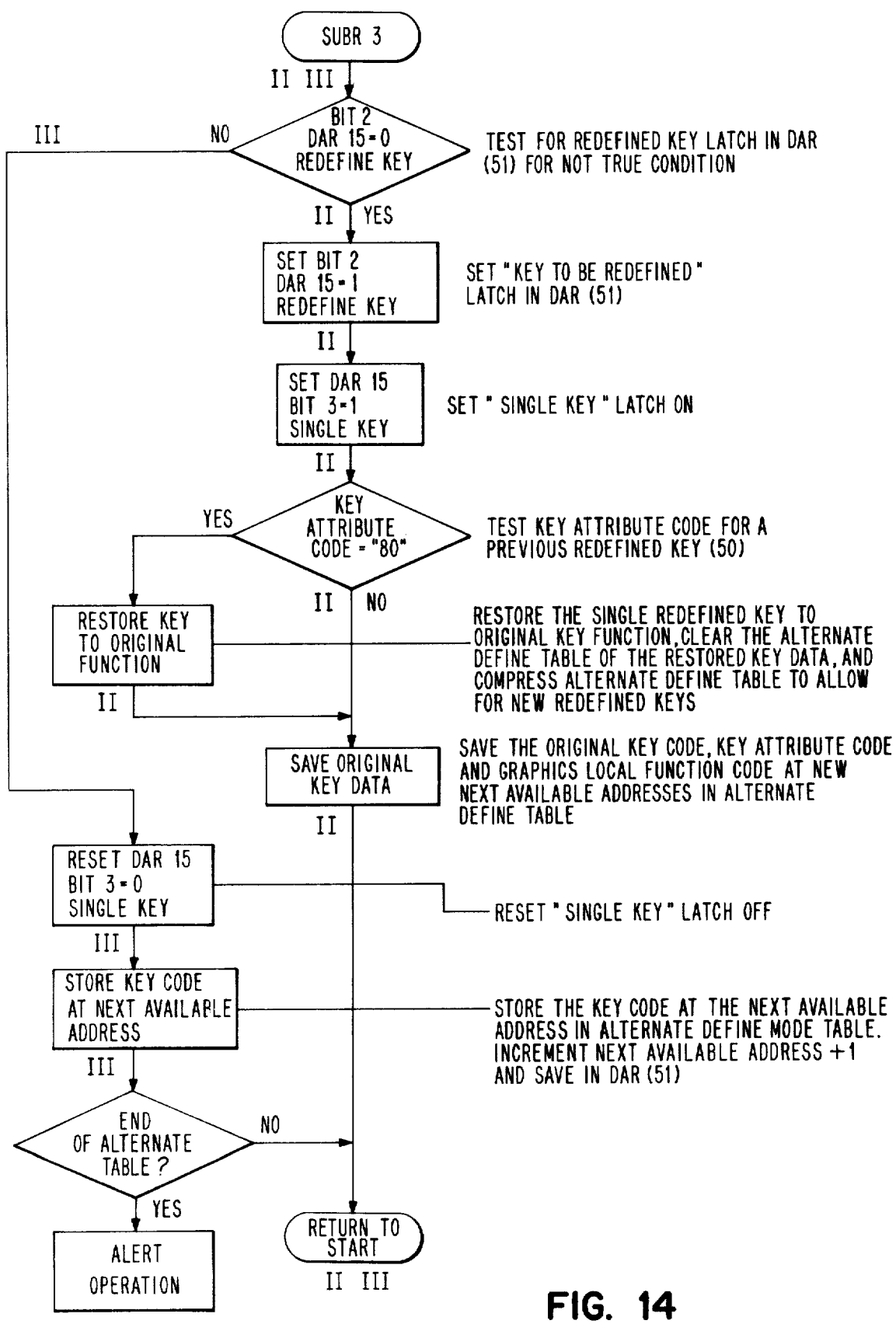

As described above, a branch is taken to subroutine SUBR 3 of FIG. 14 when a key other than the define mode key has been depressed and when we have determined that we are in the define mode of operation. The first step in subroutine SUBR 3 is to test bit 2 of DAR register 15 for a logical 0 state to determine whether or not the key to be redefined is the one that has been depressed. In the event that this bit is a logical 1, then bit 3 of DAR register 15 is reset to 0, the key code of the depressed key is stored at the next available address in the alternate define table D and the next available address for accessing table D is incremented by 1 and saved in DAR registers 3–5. This address is checked against the maximum address value for the store 17 to alert the operator in the event that the address space has been exceeded. In the event that it has not been exceeded, a branch is made to the start step of the mainline routine.

If bit 2 of DAR register 15 was a logical 0 indicating that the depressed key is the one to be redefined, the subroutine SUBR 3 advances to the next sequential step. Bit 2 of DAR register 15 is set to a logical 1 state indicating that the key to be redefined has been depressed and detected. Next the single key latch is set to its one state by storing a logical 1 condition at bit 3 of the DAR register 15. The subroutine moves to the next sequential step at which a test is made to determine whether or not the key attribute code "80" is in the attribute code table at the location corresponding to the key which has been depressed. If the redefined attribute code is found to be 80, it indicates that an attempt is being made to redefine a key which is already in the redefined mode. Since the procedures for restoring that key to its original function were not performed by the operator, the program automatically performs this function of restoring the key to its original function as described elsewhere.

A next sequential step is to save the original key code, key attribute code and graphics code/location function code at the next available addresses in the alternate define table D. A return to the mainline program is then made.

As described above with respect to the mainline program, a branch is made to subroutine SUBR 4 when we are not in the define mode of operation and the key attribute code "80" is detected. The first step in subroutine SUBR 4 is to set bit 0 of the DAR register 15 to a logical 1 condition to identify the fact that we are in an execution mode for a redefined key. The index address for the alternate define table D is currently stored in DAR registers 3, 4 and 5. The contents of these registers are read out and incremented by a value of +3 and then stored into DAR registers 0, 1 and 2. The store 17 is then accessed with this incremented address in DAR registers 0, 1 and 2 to fetch the next key code in the alternate define table D. The next step uses the key code taken from the alternate define table and the origin high order bits of tables A and B and fetches the attribute code and the graphic/local function code of the key corresponding to the key code which has been accessed from the alternate define table D. A test is then made in the next step to determine whether or not the attribute key is a redefined key code of "80". If the attribute code is 80, the program moves to the next sequential step in which the character/local function table is accessed at the location corresponding to this redefined key to obtain an alternate define table D index in order to locate the original function associated with this redefined key. This step will be described in greater detail below.

In either event, whether the attribute code is "80" or not, a branch is then made to A of FIG. 11 where normal execution of the key function is performed and then bits 0 of DAR register 15 is tested for a logical 1 state as described above. In the event that this bit is a logical 1, a branch is made to subroutine SUBR 5.

Figure 15:
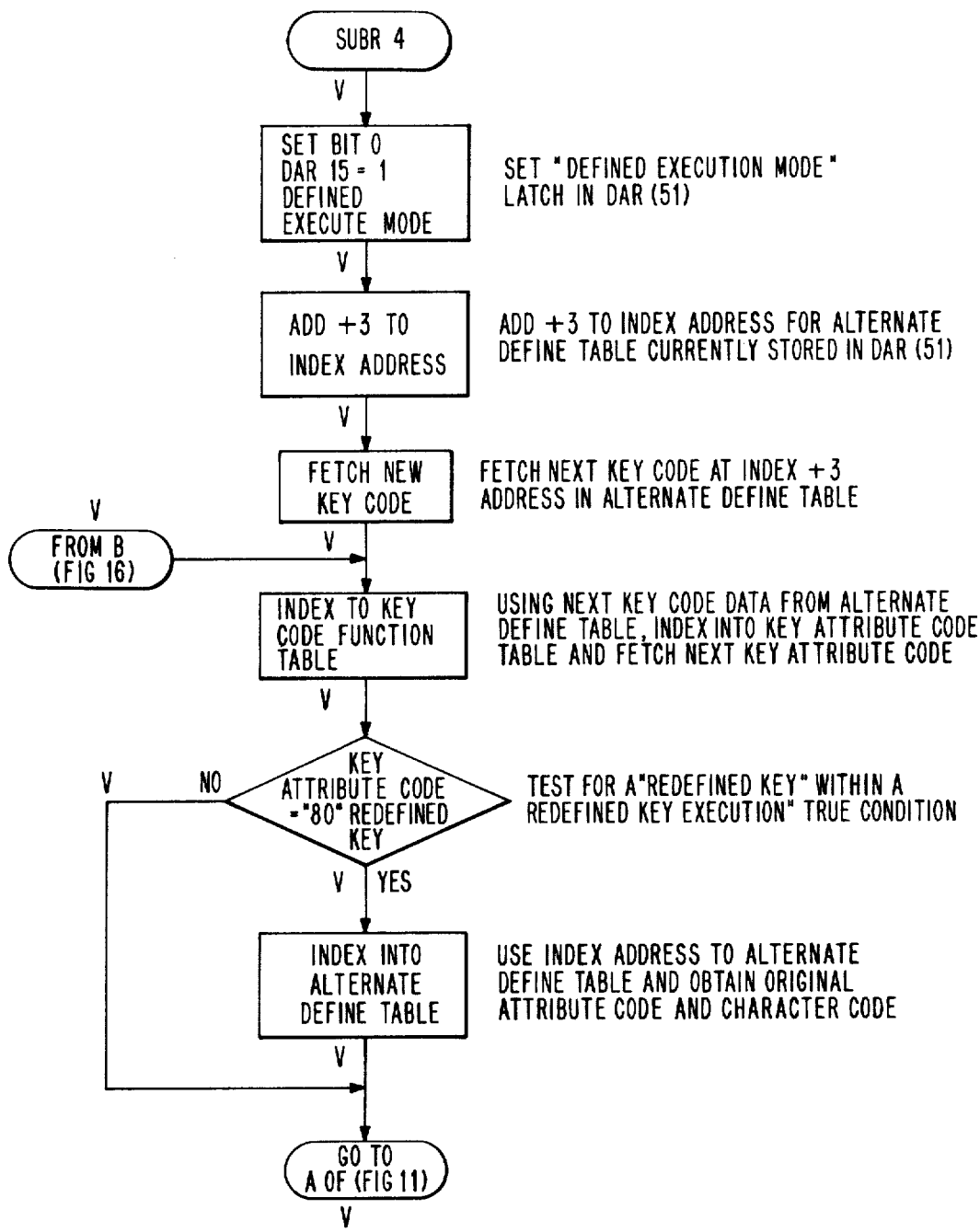
Figure 16:
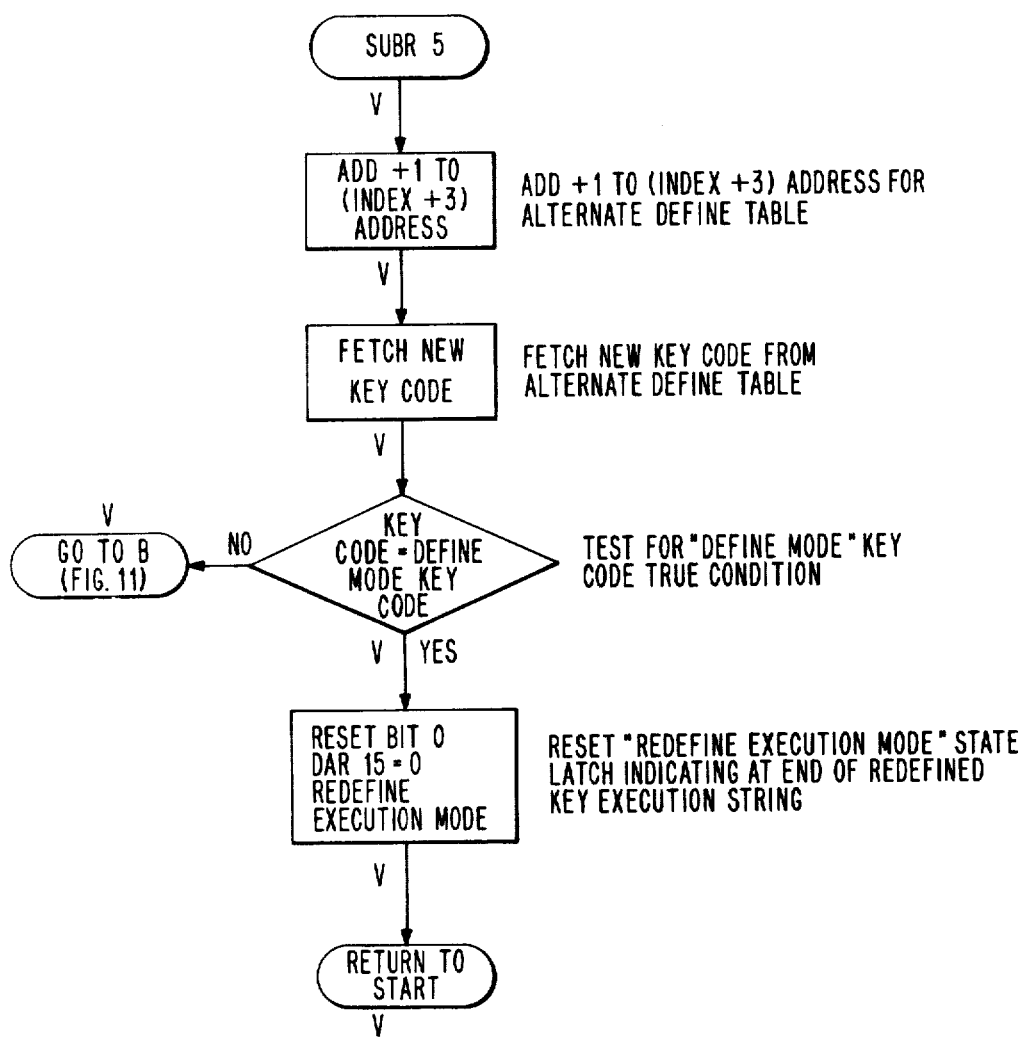

The function of subroutine SUBR 5 of FIG. 16 in conjunction with subroutine SUBR 4 of FIG. 15 is to sequentially fetch all of the key codes from the alternate define table D to cause execution of the corresponding original functions until the list of new key codes is exhausted by reason of detecting the define mode key code.

The first step of subroutine SUBR 5 is to access the next available address of the alternate define table from DAR registers 3, 4 and 5 and increment this address by +1. Using this incremented address, a fetch of the next succeeding key code from the alternate define table is made. The next step includes a test for the define mode key code true condition. If the define mode key code is detected, the next sequential step in subroutine SUBR 5 is executed to reset bit 0 of DAR register 15 to a logical 0 state and branch to the start position of the mainline program of FIG. 11. If the key code is other than the define mode key code, then a branch is made to SUBR 4. The key code is used to access the codes from tables A and B corresponding to the key code which was accessed from the alternate define table. Assuming the attribute code is not that of a redefined key, the attribute code and the corresponding character code/local function code are used to execute the corresponding key function after a return is made to point A in the mainline program of FIG. 11. In this manner a sequential accessing of key codes and execution of their corresponding functions is continued until the define mode key is detected indicating the end of the redefined series of functions.

EXECUTION OF ORIGINAL KEY FUNCTION (FIG. 9)

Figure 9:
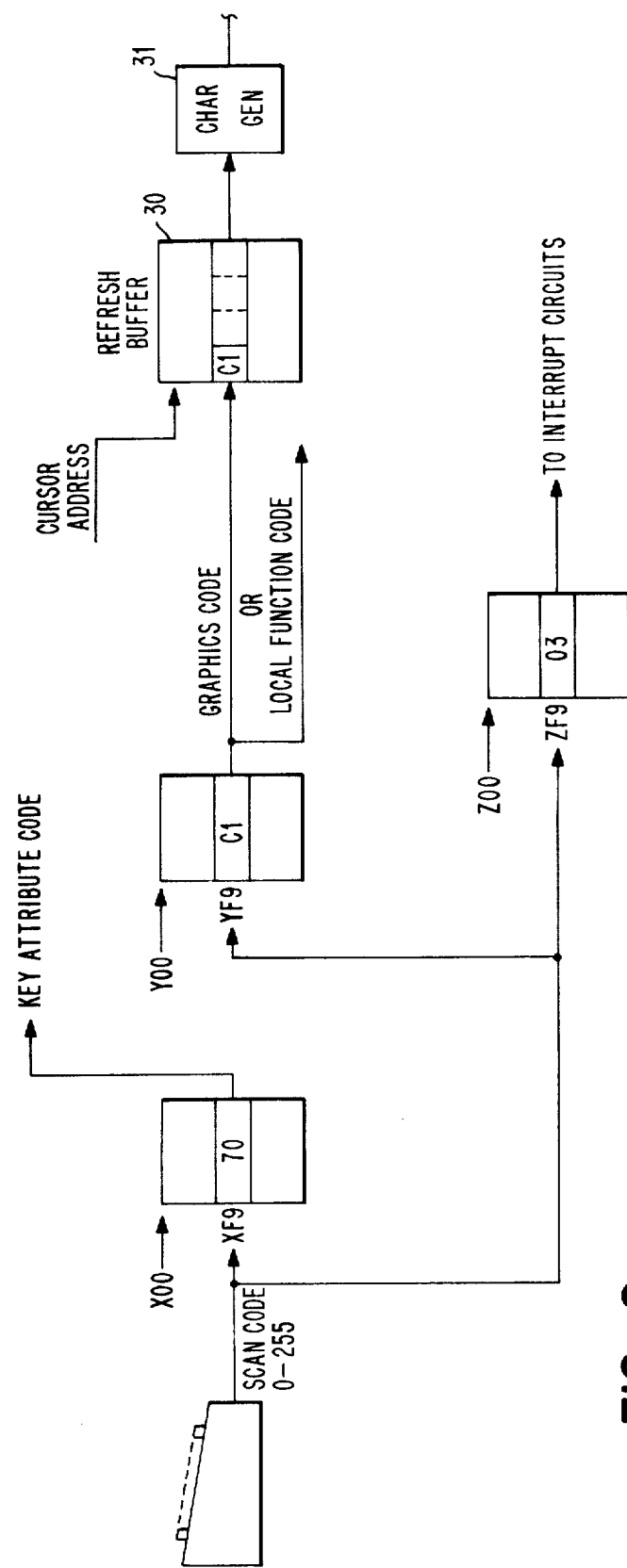
FIG. 9 illustrates diagrammatically the entry of a graphics character on the display incident to the depression of a key on the keyboard.

A description will now be made of the general sequence of microprocessor instruction steps required to access the various tables in store 17 to extract the required keyboard oriented data necessary to perform a desired original (i.e. non-redefined) operator key entry function. FIG. 9 illustrates, by way of example, one such function.

The key code from keyboard (11) is stored, after key entry detection, in DAR registers 6 and 7 (FIG. 8).

Next, a constant binary value "X" is moved into DAR register 0, which value represents the high order address bits which point to the origin of Key Attribute Table A (FIG. 7) of store 17.

Next, the key code stored in DAR registers 6 and 7 is moved into DAR registers 1 and 2 to form the remainder of the address to index into Table A.

Next, a read memory instruction is issued by the instruction sequence, which instruction utilizes the contents of DAR 0, 1 and 2 as an address pointer into store 17 to extract the contents of Table A at that address location. The contents of Table A location XF9 is the key attribute code "70" which is used to specify to the program the category of key operation to be performed for the particular key depressed. The attribute code "70" defines a graphic character and interrupting key operation.

The key attribute code "70" causes the program to branch to a routine, which, first, determines the graphic character code for the depressed key and stores that character code into the refresh buffer 30, and, secondly, determines the interrupt code to send to the host CPU 1. More specifically, a constant binary value "Y" is moved into DAR register 0, which value defines the origin of Table B. The key code stored in DAR registers 1 and 2 to access Table A is retained to access Tables B and C.

Next, a read memory instruction is issued by the microprocessor instruction sequence and utilizes the contents of DAR registers 0, 1 and 2 to extract the contents of Table B at address location YF9.

The contents of "C1" of Table B location YF9 is the graphic character code corresponding to the character "A". The character code C1 is moved from store 17 into the A and B registers 36 and 37 and then into the data register 120 for subsequent entry into the refresh buffer 30.

The current contents of the X register 122 and Y register 123 contain the address of the refresh buffer 30 where the next graphic character is to be stored. Accordingly, subsequent microcontroller instructions cause the graphic code C1 to be entered into the refresh buffer 31 for subsequent video display of the character "A" via the character generator 31 and video output gates 87 and 88. Microcontroller instructions increment the contents of the X and Y registers 122, 123 in preparation for the next graphic character key entry operation.

Immediately following the entry of the graphic character code "C1" into the refresh buffer 30, the instruction routine causes a constant Z to be moved into DAR register 0 which constant defines the origin of Table C.

The key code "F9" has been retained in DAR registers 1 and 2 to access Table C.

Next, a read memory instruction is issued by the microprocessor instruction sequence using the contents of DAR registers 0, 1 and 2 as an address pointer into store 17 to extract the contents of Table C at address location ZF9. The contents of that Table C address location is the interrupt code value 03 which is moved into the A and B registers 36, 37 and then into the channel interface electronics 13 via bus 18 for subsequent transfer to host processor 1.

Finally, a microprocessor instruction step causes the keyboard strobe latch 81 to be cleared in order to become available for the next key entry input. This completes the operational steps required for one original (non-redefined) key entry execution.

In the event that a key is depressed and its key is determined to be a local function "20" in Table A, then the microcontroller program will vector to the routine using an index address derived from the location in Table B corresponding to the depressed key to execute that particular function. For example, if a "move cursor right one position" is to be executed when a key is depressed, the microcontroller driving program will update the X register 122 and Y register 123 using lines 125 and 126 and bus 18; and will subsequently cause the cursor to be indexed to the right one position, utilizing the cursor address comparator 134 and control logic 95, delay circuit 96, and line 21 to the display 10.

REDEFINING THE FUNCTION OF KEY (FIG. 10)

The keyboard operator can redefine the function of any key on the keyboard 11 except the define mode key. This feature allows the local keyboard operator to select, from the full set or library of available original key functions in tables B and C located in store 17 for keyboard 11, any sequence of those original key functions to be reassigned to any particular key 11-1 to 11-n. This feature requires the introduction of a mode of operation to the display terminal 4-n and control apparatus 5-n called define mode. In the define mode, the local keyboard operator defines the sequence of available interrupt functions, local key functions and/or graphic functions that is to be assigned to any selected key. Once the sequence of key functions has been assigned to a key by the operator, the operator exits the define mode of operation; and subsequently any depression of the selected and redefined key causes the execution of the sequence of functions that were operator assigned for that key and in the order of the operator assignment sequence. All or several keys on keyboard 11 may be redefined concurrently. Depression of the define mode key causes the display terminal system to enter the define mode. Assignment of the user selected key position to the define mode is made in the key attribute table A, which table is loaded from central processing unit 1 into the store 17 during IPL. A key attribute of "40" is assigned for the define mode key in the Table A. The define mode key is reserved and not reassignable except by reinitializing the tables.

Figure 10:
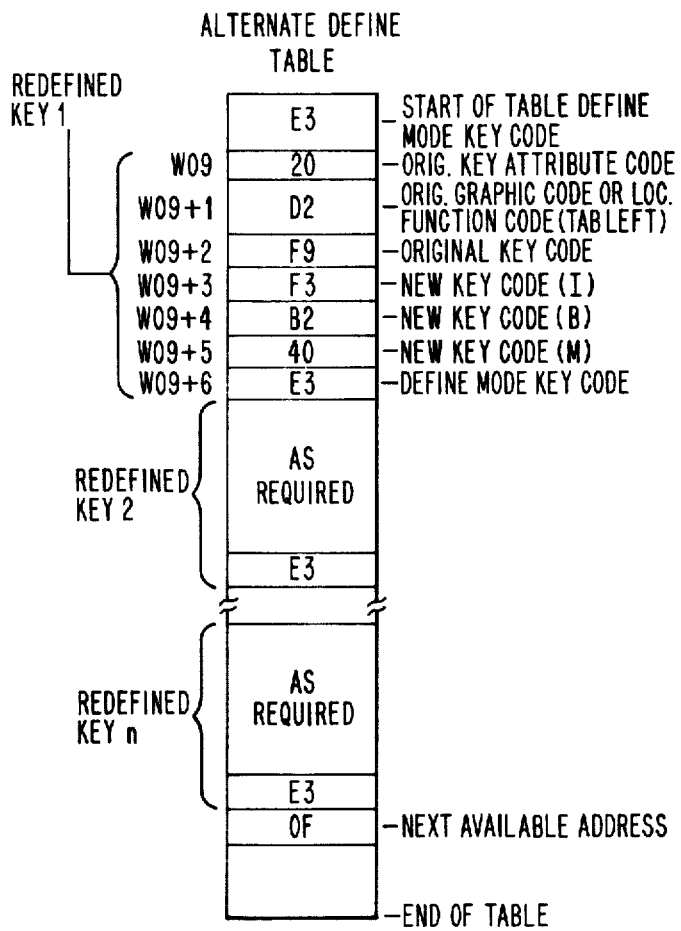
FIG. 10 illustrates the table entries associated with a redefined key.

The following description illustrates the sequence of events causing the redefinition of a selected key, reference being directed to FIG. 10.

When the operator depresses the define mode key, the unique key code E3 is entered into keyboard latch 80 by way of bus 22 and the keyboard strobe latch 81 is set by a signal on line 23. The instruction sequence in store 17 reads the key code into the microcontroller 15 via data bus 19; and the key code is used by the instruction routine to access the key attribute table A at location XE3. The key attribute "40" at address XE3 indicates that the define mode key was depressed. The microcontroller 15 is caused to enter a define mode of operation. The second key that the operator depresses is the key selected to be redefined. Its key code F9 is detected in the same manner as that of the define mode key and causes an index into the key attribute table A at location XF9.

A search is also made in Table D for the next available address (unused), WO9 for the present example.

The original key attribute 20 originally contained in XF9 of Table A and the original graphic character code or local function code D2 contained in Table B at location YF9 along with the key code F9 itself are stored at the next available locations WO9, WO9+1 and WO9+2 in the alternate define table D. A new attribute code "80" is inserted at address XF9 in Table A to signify a redefined key. In addition, the index address O9 into Table D is stored at the key code address XF9 in Table B. Subsequent key depressions by the operator dictate the sequence of keyboard functions to be assigned to the redefined key.

As each new key function is assigned to the redefined key, its key code is stored in Table D. Thus key codes F3, B2 and 40 corresponding to characters IBM respectively are stored at positions WO9+3, WO9+4 and WO9+5 in Table D when their respective keys are depressed. The operator must depress the define mode key to end the define mode of operation. The key code E3 for the redefine key is added to Table D of FIG. 7 to indicate the end of the character redefinition string.

Additional keys to be redefined if so desired by the operator are changed using a similar sequence of key depressions and the new sequence for each key redefinition is added to table D. Subsequently, any depression of a redefined key causes the program to index into the attribute table A which indicates that the key has been redefined and Table B is subsequently indexed to extract the index address to Table D which then defines the key codes for locating the sequence of routines to execute the redefined key functions.

The index address from Table B into Table D must be incremented by +3 to skip over the original key parameters stored in Table D to access the key codes of the new functions. The original key parameters are stored to allow the operator to restore any particular redefined key or all redefined keys to their originally assigned function.

EXECUTION OF REDEFINED KEY FUNCTIONS (FIG. 10)

A description will now be made of the general sequence of microprocessor instruction steps required to access the various storage tables of FIG. 7 to extract the required keyboard oriented data necessary to perform a redefined key entry function. An example is illustrated in FIG. 10.

The key code F9 from keyboard 11 is stored, after key entry detection in registers 6, 7 of DAR 51, (FIG. 8).

Next, a constant binary value X (determined by the program) is moved into DAR register 0. This value X represents the high order address bits which are used to point to the origin of Table A.

Next, the key code data binary value F9, currently stored in DAR registers 6 and 7, is moved into DAR registers 1 and 2 to form the remainder of the binary address to index into Table A of read/write store 17.

Next, a read store instruction is issued by the microprocessor instruction sequence, which instruction utilizes the contents of DAR 0, 1 and 2 as an addres pointer into store 17 to extract the contents of Table A, address location XF9. The content of this location is the key attribute code 80, which is used to specify, to the sequential program, the category of key operation to be performed for the particular key which has been depressed.

The specific example of FIG. 10 has an attribute code of "80" which signifies a redefined key. The redefined key has been previously redefined by the keyboard operator, i.e. to produce three graphic characters, I, B, M in that sequence, in lieu of the original function.

The key attribute code of "80" causes the program to branch to a specific routine which accesses the three graphic character codes and stores them into the refresh buffer 30.

More specifically, a constant binary value Y is moved into DAR register 0, which defines the origin of Table B.

The key code binary value F9 currently stored in DAR 1 and 2 is retained from the previous instructions, since that data represents the same corresponding index into Table B as it does into Table A.

Next, a read memory instruction is issued by the microprocessor instruction sequence which utilizes the binary value contents of DAR registers 0, 1 and 2 as an address pointer into store 17 to extract the contents of Table B at address location YF9.

The content of location YF9 is binary value "09" which is an address value used to index into the alternate refine table D. The binary value "09" is incremented in value by a plus "3" binary value to "12" within the microprocessor, utilizing sequential instructions well known to accomplish that purpose. This address is used to fetch the first new key code F3 as indicated in the example of FIG. 10.

More specifically, the incremented index value O9+3 is moved into DAR registers 1 and 2 and is also saved in DAR registers 4 and 5 for the next redefined key code index address.

The instruction routine causes the constant W to be moved into DAR register 0, which defines the origin of Table D, and to be saved in DAR register 3.

Next, a read memory instruction is issued by the microprocessor instruction sequence, which instruction utilizes the binary value contents (WO9+3) of DAR 0, 1 and 2 as an address pointer into store 17 to extract the contents of Table D at location WO9+3. The content F3 of that Table D address is the key code corresponding to the first graphic character "I" for the redefined key sequence.

The key code "F3" is moved into DAR registers 1 and 2 to form the index address into Table A.

The constant "X" is moved into DAR register 0, to represent the highest order address bits for Table A.

Next, a read memory instruction is issued by the microprocess instruction sequence, which instruction utilizes the contents of DAR registers 0, 1 and 2 as an address pointer into store 17 to extract the contents of Table A at that address location. The extracted contents of "00" are the key attribute code of a graphics character or symbol.

Next, the attribute code 00 causes the program to branch to a specific routine for determining the graphic character code corresponding to key code F3 and for storing the character code into the refresh buffer 30.

More specifically, the constant binary value Y is moved into DAR register 0.

The key code F3 currently stored in DAR registers 1 and 2 is retained from the previous instructions since it is used to index into Table B as well as into Table A.

Next, a read memory instruction is issued by the microprocessor instruction sequence, which instruction utilizes the contents of DAR registers 0, 1 and 2 as an address pointer into storage 17 to extract the contents of Table B at address YF3. The contents of location YF3 is the graphic character code "C2" for the character "I", which code is then moved via assembly 38, A and B registers 36, 37 and bus 18 into Data Reg. 120 (FIG. 4A) for subsequent entry into the refresh buffer 30.

The current contents of the X and Y registers 122, 123 contain the binary address of the refresh buffer where the next graphic character code is to be stored, i.e. the cursor address. Accordingly, subsequent microcontroller instructions cause the graphic character code C2 to be entered into the refresh buffer 30 for subsequent video display of the character "I" via the character generator (31) and video output gates (87) and (88).

Subsequent microcontroller instructions increment the contents of the X and Y registers 122, 123 in preparation for the next graphic character key entry operation.

Immediately following the current entry of the graphics character code "I" into the refresh buffer, the instruction routine accesses the next alternate define table address WO9+3 from DAR registers 3, 4, 5 and increments the address by +1.

The new address value WO9+4 is moved into DAR registers 0, 1 and 2 to provide the address in Table D for fetching the "second" graphic character "B" indicated in the example of FIG. 10. The new address value is also stored in DAR registers 3, 4, 5.

The entire process as described above for processing the graphic character "I" is then repeated for the graphic characters "B" and "M".

When the key code "E3" is detected by the microcontroller routine, it signifies the end of the redefined graphic character string. It is detected by comparing each key code extracted from Table D, against the first code E3 of Table D as seen in FIG. 10 which code was loaded during initialization of Table D.

EXECUTION OF A REDEFINED FUNCTION WITHIN A REDEFINED KEY EXECUTION ROUTINE

The following is a description of the general sequence of microprocessor instruction steps required to access the storage tables A to D to extract the keyboard oriented data necessary to execute a redefined key function within a redefined key entry function. The example of FIG. 10 will be used as a guide.

The initial steps are identical to the initial steps in the previous example of the execution of a redefined key series of functions, i.e. the three graphic characters I, B, M.

It will be assumed that the key with the original graphic character I function has also been redefined.

When, during the previous description, the key code F3 for this function is accessed from the alternate define table D, it is used to access its location XF3 in the key attribute table A. In this instance, the key function has been redefined and the attribute code 80 is accessed.

More specifically the redefined key code value of "F3" is moved from table D into DAR registers 1 and 2 to form the index address into table A. The constant "X" is moved into DAR register 0.

Next, a read memory instruction is issued by the microprocessor instruction sequence, which instruction utilizes the contents of DAR 0, 1 and 2 as an address pointer into store 17 to extract the contents of table A at address location XF3. The content of location XF3 is the key attribute code 80 (not shown) indicating a redefined character attribute, within the redefined instruction sequence.

Next, the attribute code 80 causes the program to branch to a routine which determines the proper function for that redefined key code within a redefined key sequence.

Next, the constant binary value Y is moved into DAR register 0 to define the origin of table B.

The key code F3 is retained in DAR registers 1 and 2 from the previous instructions.

Next, a read memory instruction is issued by the microprocessor instruction sequence, which instruction utilizes the contents of DAR registers 0, 1 and 2 as an address pointer into store 17 to extract the contents of table B at location YF3. The contents into location YF3 provide an index address ii (not shown) into the alternate define table D.

The index value ii is then moved into DAR registers 1 and 2.

Next, the instruction routine causes the constant W to be moved into DAR register 0 to define the origin of table D.

Next, a read memory instruction is issued by the microprocessor instruction sequence, which instruction utilizes the contents Wii of DAR registers 0, 1 and 2 pointer into store 17 to extract the contents of table D at that location. The content of location Wii is the originally defined key attribute code, i.e. graphics attribute code 00.

The index value ii currently retained in DAR registers 1 and 2 is incremented by plus one to ii +1 and returned to DAR registers 1 and 2.

The new address in DAR registers 0, 1 and 2 is used by microprocessor instruction sequence to index into table D to extract the original graphic character code C2 for the character I. The graphic character code C2 is moved from store 17 via A and B registers 36, 37 into the data register 120 for subsequent entry into the refresh buffer 30.

The subsequent steps for the completion of graphic characters "B" and "M" are similar, as described in the previous example, assuming that they have not been redefined.

RETURN OF REDEFINED KEY TO ITS ORIGINAL FUNCTION (FIG. 10)

This section describes the sequence of local operator keyboard steps required to return any redefined key to its originally assigned key function. First, the keyboard operator depresses the define mode key which causes the controller to enter the define mode. Next, the keyboard operator depresses the keyboard key that is desired to be returned to its original function. Lastly, the keyboard operator must depress the define mode key again which causes the microcontroller instruction sequence to exit the define mode, and in addition restore that redefined key to its original function.

In addition, the data in alternate define table D in FIG. 10 is compressed such that the data for the redefined key, that has been restored to its original function, is deleted from table D and all remaining redefined key data is moved forward in table D to fill the gap left in table D by the deletion of the restored key data. This more efficiently uses storage in table D for accommodating future keys which the operator may desire to redefine.

In a similar manner, the operator may elect to return all previously redefined keys to their original key functions. First, the operator must depress the key defined as the define mode key which causes the operator to enter the define mode in the same manner as described above. The operator must once again depress the define mode key to exit the define mode. Depressing the define mode key twice in succession without any intervening key depressions causes the microcontroller instruction sequence to restore all previously redefined keys to their original functions. In addition, the alternate define table D of FIG. 7 is cleared of all data entries except E3 at location W00 to allow for future keys to be redefined by the operator.

In the description above, where the data entries in Table D are compressed after the restore function, it will be appreciated that the redefined key index pointer addresses located in table B are adjusted to reflect the changed data locations in the compressed table D.

It will be apparent to those skilled in the art that various modifications may be made by those skilled in the art without departing from the teachings of the present invention. It is obvious that a pair of keys for starting and terminating the define mode of operation can be used instead of one key. It is also apparent that manually operable means other than the keys on the keyboard can be provided for the operator to initiate and terminate the define mode functions. It is also apparent that the operations can be accomplished completely or to a greater extent by suitable hardware with cycle timing controls without departing from the spirit and intent of the present invention.

While the invention has been particularly shown and described with reference to a preferred embodiment thereof, it will be understood by those skilled in the art that the above and other changes in form and details may be made therein without departing from the spirit and scope of the invention.

What is claimed is:

1. In a system including a visual display, a keyboard having a plurality of manually operable keys, a store for holding program instructions and for holding in tables therein data which is used in assigning original and redefined functions to each of the keys, and program-controlled processing apparatus for executing original key functions including the displaying of information on the display in accordance with data entered into the apparatus by the keys, the combination therewith of:

manually operable key redefinition means, means responsive to the actuation of the key redefinition means for changing the apparatus from an execution mode to a key redefinition mode, means responsive to the depression of a first depressed key while the apparatus is in the key redefinition mode for modifying the store tables to save the original function assignment of the first depressed key, whereby the original function of the first depressed key is available for assignment as one or more of a list of functions to be assigned to the first depressed key, means responsive to the depression of each additional key thereafter depressed while the apparatus is in the key redefinition mode for modifying the state of a redefine function table corresponding to the first depressed key to accumulate the function of each said additional key in a stored sequential list of functions to be executed when said first depressed key is operated in its redefined mode, and means responsive to a second actuation of the key redefinition means for returning the apparatus to the execution mode.

2. The combination claimed in claim 1 further comprising:

means responsive to the depression of the first depressed key in its redefined mode while the apparatus is in the execution mode for executing the sequential list of functions assigned thereto.

3. The combination claimed in claim 2 further comprising means responsive to the actuation of the key redefinition means and selected keys in predetermined sequences for modifying the tables to restore, to desired redefined keys, their original assigned functions.

4. In a data processing apparatus having a keyboard with a plurality of manually operable function keys, each having an originally assigned function, and control means having a key function execution mode and a key function redefinition mode and operable in the execution mode thereof for executing said original functions in accordance with data entered into the control means from the keyboard by each of the keys, the combination comprising:

a manually operable define mode means for selecting alternatively the key function execution mode or a key function redefinition mode of the control means, and means included in said control means responsive to the manual actuation in sequence of (1) the define mode means while said control means is in its execution mode for selecting the redefinition mode for the control means, (2) a selected one of said keys whose function is to be redefined, (3) a number of said keys from a group including the selected one key whose original functions are to be performed in sequence each time the selected one key is subsequently depressed in the execution mode of the control means, and (4) the define mode means for assigning to said redefined key the sequence of original functions corresponding to said number of keys, whereby the said redefined key performs the same functions previously performed by the said number of keys operated in sequence.

5. The combination claimed in claim 4 further comprising:

execution means included in the control means responsive to the actuation of each redefined function key for executing the sequence of functions assigned to it.

6. The combination claimed in claim 4 wherein the define mode means comprises a dedicated one of said keys on the keyboard.

7. The combination claimed in claim 5 further comprising means responsive to the manual actuation of the define mode means and selected keys in predetermined sequences for conditioning said control means to save the originally assigned functions of redefined keys and to restore, to desired redefined keys, their original assigned functions.

8. The combination claimed in claim 7 wherein the control means and the means for conditioning said control means include a plurality of redefine mode status latches.

9. In a system including a keyboard with a plurality of manually operable function keys, a store for holding program instructions and for holding in tables therein data which is used in assigning original and redefined functions to each of the keys, and program-controlled processing apparatus having a key function execution mode and a key function redefinition mode and operable in the execution mode thereof for executing said original functions in accordance with data entered into the apparatus from the keyboard by the keys, the combination comprising:

a manually operable define mode means for selecting alternatively the execution or redefinition mode of the processing apparatus, and means included in the program-controlled processing apparatus responsive to the manual actuation in sequence of (1) the define mode means while the apparatus is in its execution mode for selecting the redefinition mode for the apparatus, (2) a selected one of said keys whose function is to be redefined for modifying the store tables to save the original function assignment of said selected one key, (3) a number of said keys from a group including the selected one key to create a redefine function table in said store for assigning to said redefined key the sequence of original functions corresponding to said number of keys, and (4) the define mode means to select the execution mode for the apparatus.

* * * * *